(12) United States Patent
Lowenthal et al.

(10) Patent No.: US 11,866,827 B2
(45) Date of Patent: *Jan. 9, 2024

(54) METALLIC NANOFIBER INK, SUBSTANTIALLY TRANSPARENT CONDUCTOR, AND FABRICATION METHOD

(71) Applicant: NthDegree Technologies Worldwide Inc., Tempe, AZ (US)

(72) Inventors: Mark David Lowenthal, Tempe, AZ (US); Mark Lewandowski, Tempe, AZ (US); Jeffrey Baldridge, Tempe, AZ (US); Lixin Zheng, Tempe, AZ (US); David Michael Chesler, Tempe, AZ (US)

(73) Assignee: NthDegree Technologies Worldwide Inc, Tempe, AZ (US)

( * ) Notice: Subject to any disclaimer, the term of this patent is extended or adjusted under 35 U.S.C. 154(b) by 122 days.

This patent is subject to a terminal disclaimer.

(21) Appl. No.: 17/523,046

(22) Filed: Nov. 10, 2021

(65) Prior Publication Data

US 2022/0098738 A1 Mar. 31, 2022

Related U.S. Application Data

(63) Continuation of application No. 16/593,986, filed on Oct. 5, 2019, now Pat. No. 11,198,940, which is a (Continued)

(51) Int. Cl.
*C23C 16/56* (2006.01)
*C09D 11/52* (2014.01)
(Continued)

(52) U.S. Cl.
CPC .............. *C23C 16/56* (2013.01); *B82Y 30/00* (2013.01); *B82Y 40/00* (2013.01); *C09D 11/033* (2013.01);
(Continued)

(58) Field of Classification Search
CPC .................................................... C23C 16/56
See application file for complete search history.

(56) References Cited

U.S. PATENT DOCUMENTS

| 5,908,585 A | 6/1999 | Shibuta |
| 6,265,466 B1 | 7/2001 | Glatkowski et al. |

(Continued)

FOREIGN PATENT DOCUMENTS

| EP | 1 947 702 B1 | 11/2011 |
| EP | 1 922 759 B1 | 8/2012 |

(Continued)

OTHER PUBLICATIONS

R. Adelung et al., Nanowire networks on perfectly flat surfaces, Applied Physics Letters, May 17, 1999, vol. 74, No. 20, pp. 3053-3055.

(Continued)

*Primary Examiner* — William D Young
(74) *Attorney, Agent, or Firm* — Nancy R. Gamburd; Gamburd Law Group LLC

(57) ABSTRACT

An exemplary printable composition comprises a liquid or gel suspension of a plurality of metallic nanofibers or nanowires; a first solvent; and a viscosity modifier, resin, or binder. In various embodiments, the metallic nanofibers are between about 10 microns to about 100 microns in length, are between about 10 nm to about 120 nm in diameter, and are typically functionalized with a coating or partial coating of polyvinyl pyrrolidone or a similar compound. An exemplary metallic nanofiber ink which can be printed to produce a substantially transparent conductor comprises a plurality of metallic nanofibers; one or more solvents such as 1-butanol, ethanol, 1-pentanol, n-methylpyrrolidone, cyclohexanone, cyclopentanone, 1-hexanol, acetic acid, cyclohexanol, or mixtures thereof; and a viscosity modifier, resin, (Continued)

or binder such as polyvinyl pyrrolidone or a polyimide, for example.

20 Claims, 5 Drawing Sheets

Related U.S. Application Data continuation of application No. 15/018,974, filed on Feb. 9, 2016, now Pat. No. 10,494,720, which is a continuation of application No. 13/360,999, filed on Jan. 30, 2012, now abandoned.

(60) Provisional application No. 61/447,160, filed on Feb. 28, 2011.

(51) Int. Cl.
| | | |
|---|---|---|
| *B82Y 40/00* | (2011.01) | |
| *B82Y 30/00* | (2011.01) | |
| *H01B 1/22* | (2006.01) | |
| *C09D 11/033* | (2014.01) | |

(52) U.S. Cl.
CPC ............. *C09D 11/52* (2013.01); *H01B 1/22* (2013.01); *Y10T 428/24802* (2015.01)

(56) References Cited

U.S. PATENT DOCUMENTS

| | | |
|---|---|---|
| 7,060,241 B2 | 6/2006 | Glatkowski |
| 7,064,372 B2 | 6/2006 | Duan et al. |
| 7,135,728 B2 | 11/2006 | Duan et al. |
| 7,455,793 B2 | 11/2008 | Hsu et al. |
| 7,594,982 B1 | 9/2009 | Roscheisen et al. |
| 7,655,081 B2 | 2/2010 | Dai et al. |
| 7,695,981 B2 | 4/2010 | Dai et al. |
| 7,727,578 B2 | 6/2010 | Guiheen et al. |
| 7,849,424 B2 | 12/2010 | Wolk et al. |
| 7,902,639 B2 | 3/2011 | Garrou et al. |
| 7,960,721 B2 | 6/2011 | Belcher et al. |
| 7,976,726 B2 | 7/2011 | Wang et al. |
| 7,985,527 B2 | 7/2011 | Tokunaga |
| 8,018,563 B2 | 9/2011 | Jones et al. |
| 8,018,568 B2 | 9/2011 | Allemand et al. |
| 8,043,535 B2 | 10/2011 | Kamikoriyama et al. |
| 8,049,333 B2 | 11/2011 | Alden et al. |
| 8,094,247 B2 | 1/2012 | Allemand et al. |
| 8,174,667 B2 | 5/2012 | Allemand et al. |
| 2004/0265550 A1 | 12/2004 | Glatkowski et al. |
| 2006/0052947 A1 | 3/2006 | Hu |
| 2006/0065075 A1 | 3/2006 | Chang et al. |
| 2006/0257638 A1 | 11/2006 | Glatkowski et al. |
| 2007/0065651 A1 | 3/2007 | Glatkowski et al. |
| 2007/0158642 A1 | 7/2007 | Gruner |
| 2008/0134936 A1 | 6/2008 | Kamikoriyama et al. |
| 2008/0143906 A1* | 6/2008 | Allemand ............... H10K 71/60 313/503 |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0292979 A1 | 11/2008 | Ding et al. |
| 2009/0052029 A1 | 2/2009 | Dai et al. |
| 2009/0129004 A1 | 5/2009 | Gruner |
| 2009/0130433 A1 | 5/2009 | Takada |
| 2009/0166055 A1 | 7/2009 | Guiheen et al. |
| 2009/0223703 A1 | 9/2009 | Winoto |
| 2009/0242854 A1 | 10/2009 | Li et al. |
| 2009/0274833 A1 | 11/2009 | Li et al. |
| 2009/0283304 A1 | 11/2009 | Winoto |
| 2009/0305437 A1 | 12/2009 | Allemand et al. |
| 2009/0321113 A1 | 12/2009 | Allemand et al. |
| 2009/0321364 A1 | 12/2009 | Spaid et al. |
| 2010/0002357 A1 | 1/2010 | Kim et al. |
| 2010/0130082 A1 | 5/2010 | Lee et al. |
| 2010/0294536 A1 | 11/2010 | Usami |
| 2010/0307792 A1 | 12/2010 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |
| 2011/0285019 A1 | 11/2011 | Alden et al. |
| 2012/0097059 A1 | 4/2012 | Allemand et al. |
| 2012/0103660 A1 | 5/2012 | Gupta et al. |
| 2012/0104374 A1 | 5/2012 | Allemand |

FOREIGN PATENT DOCUMENTS

| | | |
|---|---|---|
| EP | 2 251 389 B1 | 8/2012 |
| WO | WO 2005/078770 A2 | 8/2005 |
| WO | WO 2007/022226 A2 | 2/2007 |
| WO | WO 2011/008226 A1 | 1/2011 |
| WO | WO 2011/008227 A1 | 1/2011 |

OTHER PUBLICATIONS

Dongmok Whang et al., Large-Scale Hierarchical Organization of Nanowire Arrays for Integrated Nanosystems, Nano Letters, 2003, vol. 3, No. 9, pp. 1255-1259.

Adam E. Strevens et al., Nanowire array electrode in an organic light emitting diode, Proceedings of SPIE, 2003, vol. 4876, p. 168.

Jung-Yong Lee et al., Solution-Processed Metal Nanowire Mesh Transparent Electrodes, Nano Letters, 2008, vol. 8, No. 2, pp. 689-692.

Michael Matthew Crouse, Enabling One-Dimensional Nanostructured Materials through Electrochemistry with Novel Template Development: An Application towards Monocrystalline Nanowires of Cadmium Sulfide, A Dissertation, Dept. of Chemical Engineering, Notre Dame, Indiana, Dec. 2003, pp. 1-277.

Notification of Transmittal of the International Search Report and Written Opinion of the International Searching Authority, or the Declaration for International Application No. PCT/US2012/023096, dated May 21, 2012, pp. 1-14.

* cited by examiner

METALLIC NANOFIBER INK, SUBSTANTIALLY TRANSPARENT CONDUCTOR, AND FABRICATION METHOD

CROSS-REFERENCE TO RELATED APPLICATIONS

This application is a continuation of and claims priority to U.S. patent application Ser. No. 16/593,986 filed on Oct. 5, 2019, which is a continuation of and claims priority to U.S. patent application Ser. No. 15/018,974 filed on Feb. 9, 2016 and issued Dec. 3, 2019 as U.S. Pat. No. 10,494,720, which is a continuation of and claims priority to U.S. patent application Ser. No. 13/360,999 filed on Jan. 30, 2012, which is a nonprovisional and conversion of and, under 35 U.S.C. Section 119, claims the benefit of and priority to U.S. Provisional Patent Application Ser. No. 61/447,160, filed Feb. 28, 2011, inventors Mark D. Lowenthal et al., all entitled "Metallic Nanofiber Ink, Substantially Transparent Conductor, and Fabrication Method", and the related U.S. patent application Ser. No. 13/598,418, filed on Aug. 29, 2012 and issued Jun. 4, 2013 as U.S. Pat. No. 8,454,859 is also a continuation of and claims priority to U.S. patent application Ser. No. 13/360,999, all of which are commonly assigned herewith, the entire contents of which are incorporated herein by reference with the same full force and effect as if set forth in their entireties herein, and with priority claimed for all commonly disclosed subject matter.

FIELD OF THE INVENTION

The present invention in general is related to conductive inks and polymers utilized to produce a substantially transparent conductor and, in particular, is related to a composition of metallic nanofibers suspended in a liquid or gel and capable of being printed, substantially transparent conductive films and manufactures having the metallic nanofibers, and methods of manufacturing a composition of metallic nanofibers suspended in a liquid or gel to form a metallic nanofiber ink.

BACKGROUND OF THE INVENTION

Many conductive inks include a particulate metal, such as silver or aluminum, in a binder or binding medium. While such inks produce conductors (when cured) which are substantially conductive and have a comparatively low electrical impedance (or resistance), the resulting conductors are substantially opaque and do not allow the transmission of any appreciable amount of light in the visual spectrum or other important spectra, such as ultraviolet and infrared spectra.

Optically transparent conductors are needed in a wide variety of applications, however. For example, optically transparent conductors are highly desirable for making electrical contacts to diodes in photovoltaic and in light emitting applications, to allow greater light input and light output, respectively, compared to opaque conductors.

Typical printable transparent conductors, while having reasonable optical transmissivity, unfortunately often have a comparatively high electrical impedance and low conductivity when cured, with resistances typically in the range of 800-1000 or more ohms per square (e.g., polyethylene-dioxithiophene). In addition, many such transparent conductors (e.g., indium tin oxide (ITO)) require specialized deposition techniques and very high temperature processing to reduce impedance, or when cured in a resulting apparatus, tend to have limited, if any, flexibility. The inks or polymers to produce such typical transparent conductors include, for example, polyethylene-dioxithiophene (e.g., "Orgacon" from AGFA Corp. of Ridgefield Park, New Jersey, USA), a combination of poly-3,4-ethylenedioxythiophene and poly-styrenesulfonic acid (marketed as Baytron P and available from Bayer AG of Leverkusen, Germany), a polyaniline or polypyrrole polymer, carbon nanotubes (CNTs), and/or antimony tin oxide (ATO) (with the CNTs, ATO or others typically suspended as particles in any of the various binders, polymers or carriers).

Other printable transparent conductors require significant additional processing after printing. For example, some are created as separate unitary sheets or films which must be laminated onto a substrate, and then subsequently patterned to form the desired, electrically isolated conductors having specific electrical connections, such as through an etching process. Other printable transparent conductors also require significant additional processing following deposition, such as acid washing followed by significant physical compression in nip rollers, for example, in order to create conductive connections among metallic nanowires forming the conductors. Other printable transparent conductors are fragile when deposited, and may further require additional stabilization layers to hold the deposited but unstable metallic nanowires in place. These types of printable transparent conductors have limited usefulness, however, as they cannot be readily utilized to provide electrical connections to devices, such as diodes, which are already placed on a substrate and which should not be subjected to potentially irreparably damaging treatments such as acid washes, etching, or compressive forces, for example.

Accordingly, a need remains for a conductive ink, polymer or composition which may be printed and, when cured, produces a resulting conductor which is stable, fixed in place, and capable of providing electrical connections to devices, and further provides a comparatively low electrical impedance (or resistance) while simultaneously allowing substantial light transmission in the visual or other spectra. In addition, a need remains for such a composition to be capable of curing into a stable conductor at comparatively lower processing temperatures, and be suitable for a wide variety of applications, such as for use in lighting and photovoltaic panels.

SUMMARY

The exemplary embodiments provide a "metallic nanofiber ink", namely, a liquid or gel suspension of metallic nanofibers which is capable of being printed, such as through screen printing or flexographic printing, for example and without limitation, to produce a substantially transparent and stable conductor when cured or solidified. An exemplary method also comprises a method of manufacturing metallic nanofiber ink which, as discussed in greater detail below, suspends a plurality of metallic nanofibers in a solvent and viscous resin or polymer mixture which is capable of being printed to manufacture various devices, such as light emitting diode (LED) devices and photovoltaic devices. Exemplary apparatuses and systems formed by printing such a metallic nanofiber ink are also disclosed.

An exemplary composition comprises a plurality of metallic nanofibers, substantially all of the metallic nanofibers at least partially coated or functionalized with a polymer; a first solvent; and a viscosity modifier, resin, or binder.

In various exemplary embodiments, the metallic nanofibers have lengths between about 1μ and about 250μ and diameters between about 10 nm and about 500 nm; or more particularly, the metallic nanofibers have lengths between about 10μ and about 150μ and diameters between about 5 nm and about 250 nm; or more particularly, the metallic nanofibers have lengths between about 10μ and about 100μ and diameters between about 10 nm and about 100 nm; or more particularly, the metallic nanofibers have lengths between about 10μ and about 80μ and diameters between about 10 nm and about 80 nm; or more particularly, the metallic nanofibers have lengths between about 1μ and about 60μ and diameters between about 10 nm and about 200 nm; or more particularly, the metallic nanofibers have lengths between about 10μ and about 70μ and diameters between about 25 nm and about 60 nm. Lastly, in various other exemplary embodiments, the metallic nanofibers have lengths between about 40μ and about 60μ and diameters between about 15 nm and about 40 nm, and/or have lengths between about 10μ and about 25μ and diameters between about 10 nm and about 15 nm.

In another exemplary embodiment, the plurality of metallic nanofibers have an aspect ratio between about 500:1 to 100:1. In another exemplary embodiment, the metallic nanofibers have an aspect ratio between about 400:1 to 200:1. In another exemplary embodiment, the metallic nanofibers have an aspect ratio between about 350:1 to 250:1. In another exemplary embodiment, the metallic nanofibers have an aspect ratio between about 350:1 to 275:1.

In an exemplary embodiment, the plurality of metallic nanofibers comprises at least one metal selected from the group consisting of: aluminum, copper, silver, gold, nickel, palladium, tin, platinum, lead, zinc, alloys thereof, and mixtures thereof.

In an exemplary embodiment, the metallic nanofibers are functionalized with a coating or partial coating of a polymer. In another exemplary embodiment, the metallic nanofibers are functionalized with a coating or partial coating of a pyrrolidone polymer. In another exemplary embodiment, the metallic nanofibers are functionalized with a coating or partial coating of polyvinyl pyrrolidone (PVP), generally in an amount of between about 0.09% to about 0.20% by weight of the coated metallic nanofibers. In various other exemplary embodiments, the metallic nanofibers are functionalized with a substantial or complete coating of polyvinyl pyrrolidone (PVP) having a comparatively low molecular weight. In another exemplary embodiment, the metallic nanofibers are functionalized with a substantial or complete coating of polyvinyl pyrrolidone having a molecular weight between about 5,000 to about 50,000 MW. Other types of coatings or functionalizations, including with different polymers, mixtures of polymers or other materials, are also within the scope of the disclosure.

In an exemplary embodiment, the first solvent comprises at least one solvent selected from the group consisting of: water; alcohols such as methanol, ethanol, N-propanol (including 1-propanol, 2-propanol (isopropanol or IPA), 1-methoxy-2-propanol), butanol (including 1-butanol, 2-butanol (isobutanol)), pentanol (including 1-pentanol, 2-pentanol, 3-pentanol), hexanol (including 1-hexanol, 2-hexanol, 3-hexanol), octanol, N-octanol (including 1-octanol, 2-octanol, 3-octanol), tetrahydrofurfuryl alcohol (THFA), cyclohexanol, cyclopentanol, terpineol; lactones such as butyl lactone; ethers such as methyl ethyl ether, diethyl ether, ethyl propyl ether, and polyethers; ketones, including diketones and cyclic ketones, such as cyclohexanone, cyclopentanone, cycloheptanone, cyclooctanone, acetone, benzophenone, acetylacetone, acetophenone, cyclopropanone, isophorone, methyl ethyl ketone; esters such ethyl acetate, dimethyl adipate, proplyene glycol monomethyl ether acetate, dimethyl glutarate, dimethyl succinate, glycerin acetate, carboxylates; glycols such as ethylene glycols, diethylene glycols, polyethylene glycols, propylene glycols, dipropylene glycols, glycol ethers, glycol ether acetates; carbonates such as propylene carbonate; glycerols such as glycerin; n-methylpyrrolidone, acetonitrile, tetrahydrofuran (THF), dimethyl formamide (DMF), N-methyl formamide (NMF), dimethyl sulfoxide (DMSO); acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof.

In an exemplary embodiment, the viscosity modifier, resin or binder comprises polyvinyl pyrrolidone (also known or referred to as polyvinyl pyrrolidinone), polyvinyl alcohol, or mixtures thereof. In another exemplary embodiment, the viscosity modifier, resin or binder comprises or further comprises a methylcellulose resin, such as a hydroxy propyl methylcellulose resin, or a hydroxy methylcellulose resin, or mixtures thereof. In another exemplary embodiment, the viscosity modifier, resin or binder comprises a polyimide.

In an exemplary embodiment, the viscosity modifier, resin or binder comprises at least one viscosity modifier, resin or binder selected from the group consisting of: polymers (or equivalently, polymeric precursors or polymerizable precursors) such as polyvinyl pyrrolidone (also referred to or known as polyvinyl pyrrolidinone), polyvinyl alcohol, polyimide polymers and copolymers (including aliphatic, aromatic and semi-aromatic polyimides), acrylate and (meth)acrylate polymers and copolymers; glycols such as ethylene glycols, diethylene glycol, polyethylene glycols, propylene glycols, dipropylene glycols, glycol ethers, glycol ether acetates; clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxyl ethylcellulose, cellulose ether, cellulose ethyl ether, chitosan; fumed silica, silica powders, modified ureas; and mixtures thereof.

In various exemplary embodiments, the composition further comprises a second solvent different from the first solvent. In an exemplary embodiment, the second solvent is at least one solvent selected from the group consisting of: water; alcohols such as methanol, ethanol, N-propanol (including 1-propanol, 2-propanol (isopropanol or IPA), 1-methoxy-2-propanol), butanol (including 1-butanol, 2-butanol (isobutanol)), pentanol (including 1-pentanol, 2-pentanol, 3-pentanol), hexanol (including 1-hexanol, 2-hexanol, 3-hexanol), octanol, N-octanol (including 1-octanol, 2-octanol, 3-octanol), tetrahydrofurfuryl alcohol (THFA), cyclohexanol, cyclopentanol, terpineol; lactones such as butyl lactone; ethers such as methyl ethyl ether, diethyl ether, ethyl propyl ether, and polyethers; ketones, including diketones and cyclic ketones, such as cyclohexanone, cyclopentanone, cycloheptanone, cyclooctanone, acetone, benzophenone, acetylacetone, acetophenone, cyclopropanone, isophorone, methyl ethyl ketone; esters such ethyl acetate, dimethyl adipate, proplyene glycol monomethyl ether acetate, dimethyl glutarate, dimethyl succinate, glycerin acetate, carboxylates; glycols such as ethylene glycols, diethylene glycols, polyethylene glycols, propylene glycols, dipropylene glycols, glycol ethers, glycol ether acetates; carbonates such as propylene carbonate; glycerols such as glycerin; n-methylpyrrolidone, acetonitrile, tetrahydrofuran (THF), dimethyl formamide (DMF), N-methyl formamide (NMF), dimethyl sulfoxide (DMSO); acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof. Additional different third, fourth, or more solvents may also be utilized.

In an exemplary embodiment, the metallic nanofibers are present in an amount between about 0.01% to 3.0% by weight. In various other exemplary embodiments, the metallic nanofibers are present in an amount between about 0.03% to 2.5% by weight; or more particularly, an amount between about 0.05% to 2.0% by weight; or more particularly, an amount between about 0.05% to 1.5% by weight; an amount between about 0.075% to 1.0% by weight; or more particularly, an amount between about 0.14% to 0.75% by weight; or more particularly, an amount between about 0.15% to 0.55% by weight; or more particularly, an amount between about 0.16% to 0.35% by weight; or more particularly, an amount between about 0.17% to 0.32% by weight; or more particularly, an amount between about 0.18% to 0.30% by weight; or more particularly, an amount between about 0.20% to 0.29% by weight; or more particularly, an amount between about 0.21% to 0.25% by weight. Lastly, in another exemplary embodiment, the metallic nanofibers are present in an amount between about 0.22% to 0.24% by weight.

In an exemplary embodiment, the first solvent comprises 1-butanol and is present in an amount of about 3 percent to 10 percent by weight, and the viscosity modifier, resin or binder comprises a polyimide and is present in an amount of about 0.75% to 5% by weight.

In another exemplary embodiment, the first solvent comprises cyclohexanone, is present in an amount of about 0.05 percent to 99.95 percent by weight, and the viscosity modifier, resin or binder comprises a polyimide and is present in an amount of about 0.75% to 5% by weight.

In another exemplary embodiment, the viscosity modifier, resin or binder comprises polyvinyl pyrrolidone and is present in an amount of about 0.75% to 5% by weight, the first solvent comprises 1-butanol and the second solvent comprises cyclohexanol, and the first solvent is present in an amount of about 3 percent to 10 percent by weight and the second solvent is present in an amount of about 50 percent to 95 percent by weight.

Another exemplary composition further comprises an organic acid present in an amount of about 0.1% to 2% by weight, the organic acid comprising at least one acid selected from the group consisting of: carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; and mixtures thereof.

Another exemplary composition further comprises a third solvent, the third solvent different from the first solvent and the second solvent, the third solvent present in an amount of about 0.1% to 10% by weight. In an exemplary embodiment, the third solvent is at least one solvent selected from the group consisting of: acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof.

In an exemplary embodiment, the first solvent is present in an amount of about 1% to 10% by weight and comprises at least one solvent selected from the group consisting of: 1-butanol, ethanol, 1-pentanol, 1-hexanol, acetic acid, cyclohexanone, cyclopentanone, and mixtures thereof; the viscosity modifier, resin, or binder is present in an amount of about 0.75% to 5.0% by weight and comprises at least one viscosity modifier, resin, or binder selected from the group consisting of: polyvinyl pyrrolidone, a mixture of polyvinyl pyrrolidone with polyvinyl alcohol, and/or a polyimide; and the second solvent is present in an amount of about 1.75% to 98.25% by weight and comprises at least one solvent selected from the group consisting of: cyclohexanol, cyclohexanone, cyclopentanol, butyl lactone, and mixtures thereof. Additional third, fourth or more solvents may also be utilized. A method of making the composition is also disclosed, with the method comprising, for a polyvinyl pyrrolidone embodiment: mixing the plurality of metallic nanofibers with 1-butanol and cyclohexanol, for example; mixing polyvinyl pyrrolidone and cyclohexanol; heating the mixture of polyvinyl pyrrolidone and cyclohexanol to between about 80° C. to about 90° C.; cooling the mixture of polyvinyl pyrrolidone and cyclohexanol to about 25° C.; adding the mixture of the plurality of metallic nanofibers with 1-butanol and cyclohexanol to the mixture of polyvinyl pyrrolidone and cyclohexanol; and mixing the plurality of metallic nanofibers, 1-butanol, polyvinyl pyrrolidone and cyclohexanol for about 3 to 10 minutes in an air atmosphere at standard temperature (about 25° C.) and pressure (about one atmosphere). In an exemplary embodiment, about 0.1% to 2% of acetic acid is also added.

In yet another exemplary embodiment, the plurality of metallic nanofibers are coated with polyvinyl pyrrolidone and the plurality of metallic nanofibers are present in an amount of about 0.01% to 3.0% by weight; the first solvent is present in an amount of about 1% to 10% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 0.75% to 5.0% by weight and comprises at least one viscosity modifier, resin, or binder selected from the group consisting of: polyvinyl pyrrolidone, a polyimide, and mixtures thereof; and further comprising a second solvent present in an amount of about 2.75% to 97.25% by weight, wherein the second solvent comprises at least one solvent selected from the group consisting of: cyclohexanol, cyclohexanone, cyclopentanol, butyl lactone, and mixtures thereof.

In another exemplary embodiment, the plurality of metallic nanofibers are coated with polyvinyl pyrrolidone and the plurality of metallic nanofibers are present in an amount of about 0.01% to 3.0% by weight; the first solvent is present in an amount of about 2.5% to 8.0% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 1.0% to 4.5% by weight and comprises at least one viscosity modifier, resin, or binder selected from the group consisting of: polyvinyl pyrrolidone, a polyimide, and mixtures thereof; and further comprising a second solvent present in an amount of about 4.5% to 95.5% by weight, wherein the second solvent comprises at least one solvent selected from the group consisting of: cyclohexanol, cyclohexanone, cyclopentanol, butyl lactone, and mixtures thereof.

In another exemplary composition, the plurality of metallic nanofibers are coated with polyvinyl pyrrolidone and the plurality of metallic nanofibers are present in an amount of about 0.01% to 3.0% by weight; the first solvent is present in an amount of about 2.5% to 8.0% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 1.0% to 4.5% by weight and comprises at least one viscosity modifier, resin, or binder selected from the group consisting of: polyvinyl pyrrolidone, a polyimide, and mixtures thereof; further comprising a second solvent present in an amount of 0.01% to 5.0% by weight, the second solvent comprising an acid or a base; and further comprising a third solvent present in an amount of about 4.5% to 95.4% by weight, the third solvent comprising at least one solvent selected from the group consisting of: cyclohexanol, cyclohexanone, cyclopentanol, butyl lactone, and mixtures thereof.

In an additional exemplary composition, the plurality of metallic nanofibers are coated with polyvinyl pyrrolidone and the plurality of metallic nanofibers are present in an amount of about 0.01% to 3.0% by weight; the first solvent is present in an amount of about 2.5% to 8.0% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 1.0% to 4.5% by weight and comprises at least one viscosity modifier, resin, or binder selected from the group consisting of: polyvinyl pyrrolidone, a polyimide, and mixtures thereof; further comprising a second solvent present in an amount of 0.01% to 5.0% by weight, wherein the second solvent comprises at least one solvent selected from the group consisting of: acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof; and further comprising a third solvent present in an amount of about 4.5% to 95.4% by weight, the third solvent comprising at least one solvent selected from the group consisting of: cyclohexanol, cyclohexanone, cyclopentanol, butyl lactone, and mixtures thereof.

In another exemplary embodiment, the plurality of metallic nanofibers are coated with polyvinyl pyrrolidone and the plurality of metallic nanofibers are present in an amount of about 0.18% to about 0.3% by weight; the first solvent is present in an amount of about 2.5% to 8.0% by weight and comprises at least one solvent selected from the group consisting of: 1-butanol, ethanol, 1-pentanol, n-methylpyrrolidone, cyclohexanone, 1-hexanol, and mixtures thereof; the viscosity modifier, resin, or binder is present in an amount of about 1.0% to 4.5% by weight and comprises at least one viscosity modifier, resin, or binder selected from the group consisting of: polyvinyl pyrrolidone, a polyimide, and mixtures thereof; further comprising a second solvent present in an amount of 0.1% to 2.0% by weight and comprising a carboxylic acid; and further comprising a third solvent present in an amount of about 3.7% to 96.3% by weight, the third solvent comprising at least one solvent selected from the group consisting of: cyclohexanol, cyclohexanone, cyclopentanol, butyl lactone, and mixtures thereof.

In another exemplary composition, the plurality of metallic nanofibers are coated with polyvinyl pyrrolidone and the plurality of metallic nanofibers are present in an amount of about 0.01% to 3.0% by weight; the first solvent is present in an amount of about 2.5% to 8.0% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 1.0% to 4.5% by weight and is selected from the group consisting of: polyvinyl pyrrolidone, a polyimide, and mixtures thereof; further comprising a second solvent present in an amount of 0.01% to 5.0% by weight, wherein the second solvent comprises at least one solvent selected from the group consisting of: acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof; further comprising a third solvent present in an amount of about 4.5% to 95.4% by weight, the third solvent comprising at least one solvent selected from the group consisting of: cyclohexanol, cyclohexanone, cyclopentanol, butyl lactone, and mixtures thereof; and wherein the viscosity of the composition is substantially between about 200 cps to about 20,000 cps at 25° C.

In another exemplary composition, the plurality of metallic nanofibers are coated with polyvinyl pyrrolidone and the plurality of metallic nanofibers are present in an amount of about 0.01% to 3.0% by weight; the first solvent is present in an amount of about 18% to 28% by weight and comprises at least one solvent selected from the group consisting of: 1-butanol, ethanol, 1-pentanol, n-methylpyrrolidone, cyclohexanone, 1-hexanol, acetic acid, and mixtures thereof; the viscosity modifier, resin, or binder is present in an amount of about 1.4% to 3.75% by weight and comprises at least one viscosity modifier, resin, or binder selected from the group consisting of: polyvinyl pyrrolidone, a polyimide, and mixtures thereof; further comprising a second solvent present in an amount of 0.001% to 2% by weight, wherein the second solvent comprises at least one solvent selected from the group consisting of: 1-octanol, acetic acid, diethylene glycol, dipropylene glycol, propylene glycol, and mixtures thereof; and further comprising a third solvent present in an amount of about 20.4% to 79.6% by weight, the third solvent comprising at least one solvent selected from the group consisting of: cyclohexanol, cyclohexanone, cyclopentanol, butyl lactone, and mixtures thereof.

In another exemplary embodiment, the viscosity modifier, resin or binder is present in an amount of about 0.75% to 5% by weight and comprises a mixture of polyvinyl pyrrolidone and polyvinyl alcohol.

Another exemplary embodiment comprises: a plurality of metallic nanofibers, substantially all of the metallic nanofibers at least partially coated with polyvinyl pyrrolidone, the plurality of metallic nanofibers present in an amount of about 0.01% to about 3.0% by weight; a first solvent; a second solvent different from the first solvent; and a viscosity modifier, resin or binder present in an amount of about 0.75% to 5.0% by weight and comprises at least one viscosity modifier, resin, or binder selected from the group consisting of: polyvinyl pyrrolidone, a polyimide, and mixtures thereof; wherein the viscosity of the composition is substantially between about 200 cps to about 20,000 cps at 25° C.

In an exemplary embodiment the viscosity modifier, resin or binder comprises polyvinyl pyrrolidone, the first solvent comprises 1-butanol and the second solvent comprises cyclohexanol. In another exemplary embodiment, the viscosity modifier, resin or binder comprises a polyimide and is present in an amount of about 0.75% to 5% by weight, and the first solvent comprises cyclohexanone and is present in an amount of about 50 percent to 99.99 percent by weight. In another exemplary embodiment, the first solvent comprises cyclohexanone and the second solvent comprises a crosslinking agent. In another exemplary composition, the viscosity modifier, resin or binder is present in an amount of about 0.75% to 5% by weight and comprises a mixture of polyvinyl pyrrolidone and polyvinyl alcohol.

Another exemplary embodiment comprises: a plurality of metallic nanofibers, substantially all of the metallic nanofibers at least partially coated with polyvinyl pyrrolidone, the plurality of metallic nanofibers present in an amount of about 0.01% to 3.0% by weight; a first solvent present in an amount of about 0.01% to 10% by weight and comprising at least one solvent selected from the group consisting of: 1-butanol, ethanol, 1-pentanol, n-methylpyrrolidone, cyclohexanone, 1-hexanol, acetic acid, and mixtures thereof; a second solvent present in an amount of about 1.75% to 98.25% by weight and comprising at least one solvent selected from the group consisting of: cyclohexanol, cyclohexanone, cyclopentanol, butyl lactone, and mixtures thereof; and a viscosity modifier, resin or binder present in an amount of about 0.75% to 5.0% by weight and comprising at least one viscosity modifier, resin, or binder selected from the group consisting of: polyvinyl pyrrolidone, a polyimide, and mixtures thereof; wherein the viscosity of the composition is substantially between about 200 cps to about 20,000 cps at 25° C.

Various percentages of the constituents and various viscosities of the exemplary compositions are also disclosed.

In an exemplary embodiment, the viscosity modifier, resin, or binder, when dried or cured, forms a polymer or resin lattice or structure substantially about the periphery of each metallic nanofiber of the plurality of metallic nanofibers. In an exemplary embodiment, the composition is substantially optically transparent when dried or cured. In another exemplary embodiment, the composition has a relative evaporation rate less than one, wherein the evaporation rate is relative to butyl acetate having a rate of one.

A method of using the composition is also disclosed, with the method comprising: printing the composition to form an electrical contact.

An exemplary apparatus is also disclosed, comprising: a plurality of metallic nanofibers embedded in a polymer; wherein the polymer comprises at least one polymer selected from the group consisting of: polyvinyl pyrrolidone, a polyimide, and mixtures thereof.

In an exemplary embodiment, the cured or polymerized resin or polymer comprises polyvinyl pyrrolidone, or a mixture of polyvinyl pyrrolidone and polyvinyl alcohol. In another exemplary embodiment, the cured or polymerized resin or polymer comprises a cellulose resin such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, or mixtures thereof. In another exemplary embodiment, the cured or polymerized resin or polymer comprises a polyimide.

The exemplary apparatus may further comprise: at least a trace amount of a solvent; and/or at least a trace amount of a viscosity modifier; and/or at least trace amounts of a surfactant.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which.

DETAILED DESCRIPTION OF EXEMPLARY EMBODIMENTS

Figure 1:
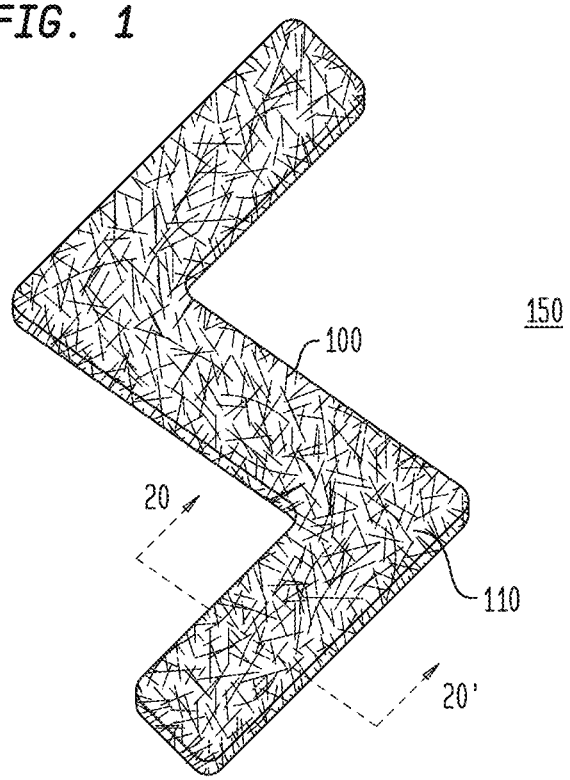
FIG. 1 is a perspective view illustrating an exemplary apparatus embodiment.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Exemplary embodiments of the invention provide a liquid and/or gel suspension of metallic nanofibers 100 which is capable of being printed, and may be referred to equivalently herein as "metallic nanofiber ink", it being understood that "metallic nanofiber ink" means and refers to a liquid and/or gel suspension of metallic nanofibers (also referred to equivalently as metallic nanowires), such as exemplary metallic nanofibers 100. An exemplary method of the invention also comprises a method of manufacturing metallic nanofiber ink which, as discussed in greater detail below, suspends a plurality of metallic nanofibers 100 in one or more solvents and a viscous resin or polymer mixture which is capable of being printed, for example, to produce a substantially transparent conductor when cured or solidified, such as for the manufacture of LED-based devices and photovoltaic devices, for example and without limitation. Exemplary conductors, apparatuses and systems formed by printing such an exemplary metallic nanofiber ink are also disclosed.

The metallic nanofiber ink disclosed herein may be deposited, printed or otherwise applied to any substrate, device, or may be deposited, printed or otherwise applied to any product of any kind or to form any product of any kind, including lighting, photovoltaic panels, electronic displays such as computer, television, tablet and mobile device displays, packaging, signage or indicia for product packaging, or as a conductor for any other product or device, such as a consumer product, a personal product, a business product, an industrial product, an architectural product, a building product, etc. The metallic nanofiber ink may be printed onto the substrate, device, article, or packaging thereof, as either a functional or decorative component of the article, package, or both. In one embodiment, the metallic nanofiber ink is printed in the form of indicia and combined with light emitting diodes. In another embodiment, the metallic nanofiber ink is printed to form electrical contacts for light emitting diodes or photovoltaic diodes. In another embodiment, the metallic nanofiber ink is printed to form electrical contacts for any two, three or more terminal device, such as a transistor or RFID tag. The article or package may be formed from any consumer-acceptable material.

For example and without limitation, the metallic nanofiber ink disclosed herein may be utilized to form any of the conductors or conductive layers, transparent or otherwise, for the apparatuses, methods, and systems referred to and disclosed in the following U.S. Patent Applications, U.S. Patents, and PCT Patent Applications, the entire contents of each of which are incorporated herein by reference with the same full force and effect as if set forth in their entireties herein, and with priority claimed for all commonly disclosed subject matter (individually and collectively referred to as the "related patent applications"): U.S. patent application Ser. Nos. 13/223,279; 13/223,286; 13/223,289; 13/223,293; 13/223,294; 13/223,297; 13/223,302; 12/753,888; 12/753,887; U.S. Pat. Nos. 7,719,187; 7,972,031; 7,992,332; U.S. patent application Ser. Nos. 12/560,334; 12/560,340; 12/560,355; 12/560,364; 12/560,371; 13/025,137; 13/025,138; PCT Patent Application Serial No. PCT/US2011/50168; PCT Patent Application Serial No. PCT/US2011/50174.

Figure 2:
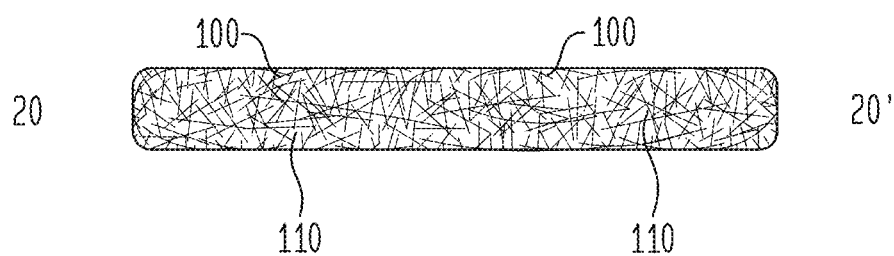
FIG. 2 is a cross-sectional view illustrating the exemplary apparatus embodiment.
Figure 3:
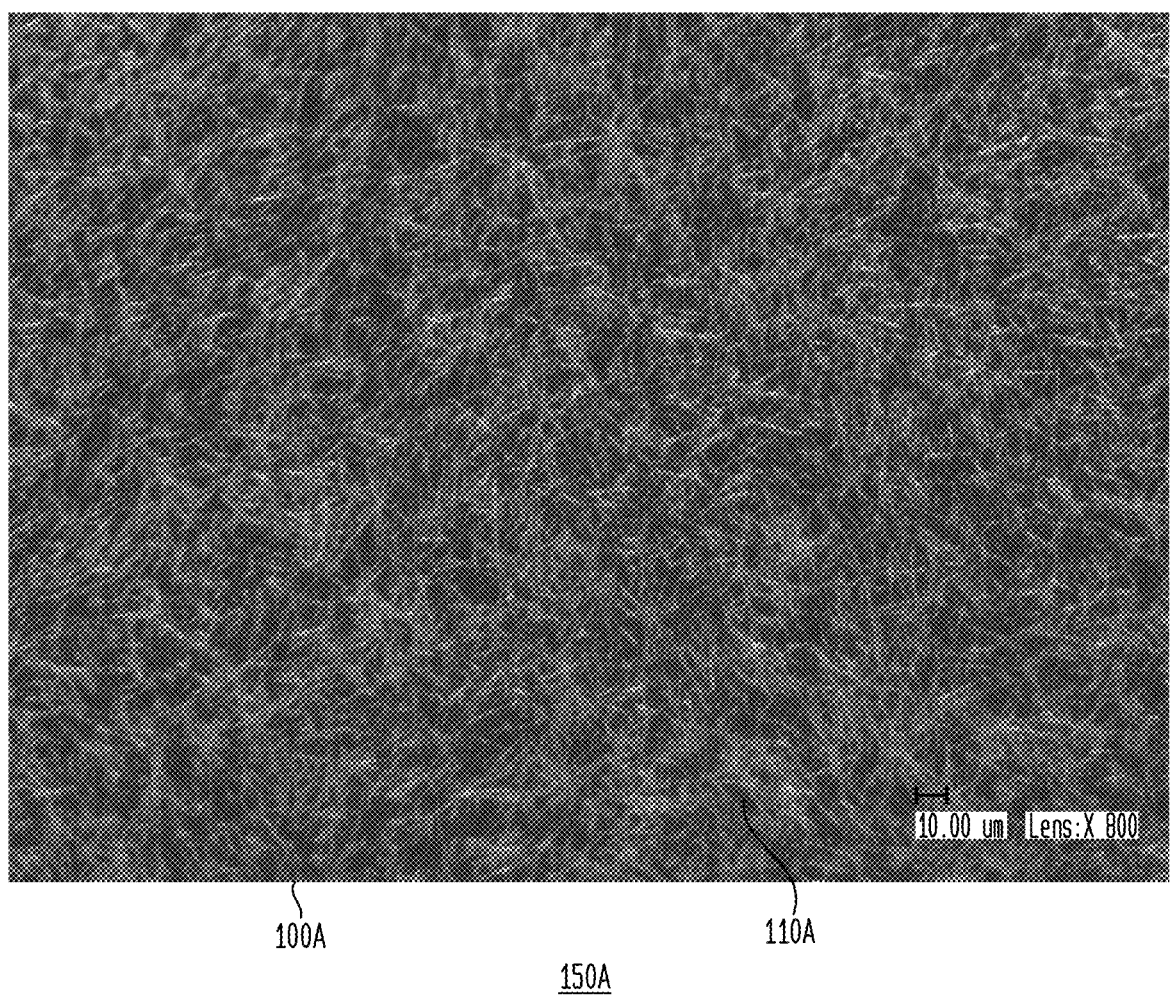
FIG. 3 is a photograph of an exemplary apparatus embodiment fabricated with an exemplary metallic nanofiber ink at a magnification of 880×.
Figure 4:
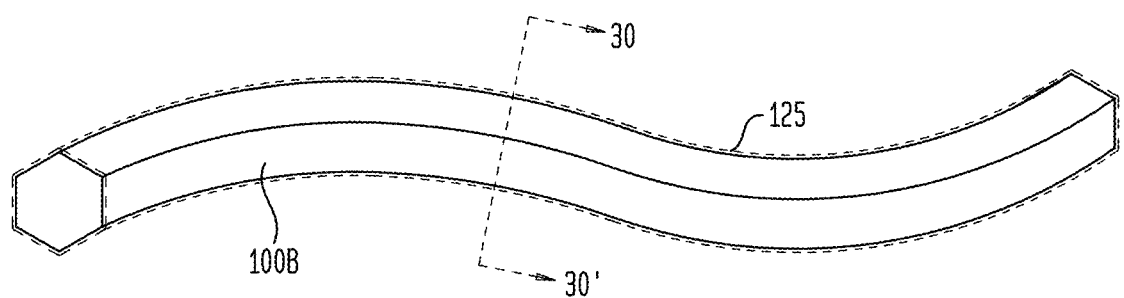
FIG. 4 is a perspective view illustrating an exemplary functionalized metallic nanofiber embodiment.
Figure 5:
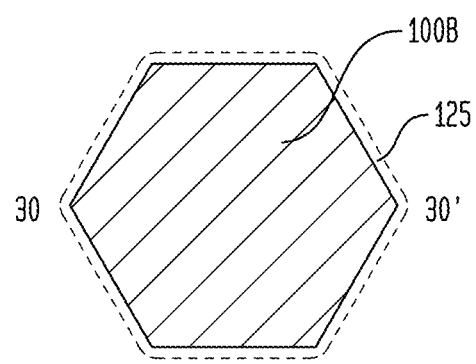
FIG. 5 is a cross-sectional view illustrating an exemplary functionalized metallic nanofiber embodiment.

FIG. 1 is a perspective view illustrating an exemplary substantially transparent conductor (or conductive apparatus) 150 embodiment. FIG. 2 is a cross-sectional view (through the 20-20' plane of FIG. 1) illustrating the exemplary substantially transparent conductor (or conductive apparatus) 150. FIG. 3 is a photograph of an exemplary substantially transparent conductor (or conductive apparatus) 150A embodiment. FIG. 4 is a perspective view illustrating an exemplary functionalized metallic nanofiber 100B embodiment. FIG. 5 is a cross-sectional view (through the 30-30' plane of FIG. 4) illustrating an exemplary functionalized metallic nanofiber 100B embodiment. In addition, referring to FIGS. 1-5, those having skill in the art will also recognize that the various Figures are for purposes of description and explanation, are not drawn to scale, and further may not illustrate any actual or preferred densities or curvatures of the metallic nanofibers 100; for example and without limitation, both the densities and the curvatures of the metallic nanofibers 100 may be considerably greater than that illustrated in FIGS. 1, 2, 4 and 5, and with various densities and percentages in the metallic nanofiber ink described in greater detail below.

Referring to FIGS. 1-2, the exemplary metallic nanofibers 100 are illustrated as at least partially embedded, primarily, in a polymerized or cured polymer or resin 110 (discussed in greater detail below), which to some extent possibly may also include residual or trace amounts of other components of the metallic nanofiber ink as discussed in greater detail below, such as depending upon cure time, to form an exemplary, substantially transparent conductor (or conductive apparatus) 150. An exemplary conductor (or conductive apparatus) 150 is typically a substantially transparent conductive film, layer, strip, electrode, wire or conductive line or trace, having any shape or form factor, such as those illustrated and discussed in the related patent applications, although other conductor (or conductive apparatus) 150 shapes and form factors are considered equivalent and within the scope of the disclosure. The substantially transparent conductor (or conductive apparatus) 150 is illustrated as an exemplary conductive line or wire in FIG. 1. An exemplary apparatus 150A is illustrated in the photograph of FIG. 3, with exemplary metallic nanofibers 100A having a length on the order of between about twenty to sixty microns (10µ-60µ) and a diameter on the order of between about twenty to one hundred nanometers (10-120 nm). The substantially transparent conductor (or conductive apparatus) 150 may be deposited to have any width and length, with the resulting depth depending to some extent upon the viscosity of the metallic nanofiber ink and the sizes (length and diameters) of the metallic nanofibers 100. Referring to FIG. 2, in exemplary embodiments, the substantially transparent conductor (or conductive apparatus) 150, once cured or dried, generally has a substantially thin form factor, generally between about 100 to 300 nm thick (or deep), or more particularly, between about 150 to 250 nm thick, or more particularly, between about 175 to 225 nm, or more particularly, on the order of about 200 nm thick when the applied metallic nanofiber ink has a viscosity on the order of 500 cps using metallic nanofibers 100 having a length on the order of between about twenty to sixty microns (10µ-60µ) and a diameter on the order of between about twenty to one hundred nanometers (10-120 nm). As a result, many of the metallic nanofibers 100 become and are at least partially exposed on the surfaces of the substantially transparent conductor (or conductive apparatus) 150.

Referring to FIG. 4, exemplary metallic nanofibers 100 may have a wide variety of shapes and sizes, and are generally or roughly cylindrically or rod-shaped, with any of various cross-sectional shapes (such as a hexagonal rod shape illustrated in FIG. 4), also may be solid or hollow (tubular), and generally having a length dimension substantially greater than a diameter dimension (also referred to as anisotropic), i.e., an aspect ratio greater than one. As illustrated in FIG. 4, for example and without limitation, an exemplary metallic nanofiber 100B is substantially hexagonal in diameter (or cross-section), having a plurality of substantially flat sides, and further may have one or more curvatures along its length dimension, as illustrated. A complete, substantial or at least a partial polymer coating 125 or other functionalization is illustrated in FIG. 4 and in cross-section in FIG. 5, as discussed in greater detail below. As mentioned above, in a first exemplary embodiment, the exemplary metallic nanofibers 100A may have a length on the order of about 10μ to about 100μ and a diameter on the order of about 10 nm to about 120 nm. More particularly, in various exemplary embodiments, the lengths and diameters of the metallic nanofibers may vary, for example: the plurality of metallic nanofibers may have lengths between about 1μ and about 250μ and diameters between about 10 nm and about 500 nm; or more particularly, may have lengths between about 10μ and about 150μ and diameters between about 5 nm and about 250 nm; or more particularly, may have lengths between about 10μ and about 100μ and diameters between about 10 nm and about 100 nm; or more particularly, may have lengths between about 10μ and about 80μ and diameters between about 10 nm and about 80 nm; or more particularly, may have lengths between about 1μ and about 60μ and diameters between about 10 nm and about 200 nm; or more particularly, may have lengths between about 10μ and about 70μ and diameters between about 25 nm and about 60 nm; or more particularly, the plurality of metallic nanofibers may have lengths between about 40μ and about 60μ and diameters between about 15 nm and about 40 nm and/or have lengths between about 10μ and about 25μ and diameters between about 10 nm and about 15 nm In addition, the selection of the lengths of the metallic nanofibers 100 for a metallic nanofiber ink may also depend upon the type of printing to be utilized. For example and without limitation, for screen printing, the lengths of the metallic nanofibers 100 may be selected for the pore or hole size of the screen or mesh, to pass through and not become caught in the screen.

In various exemplary embodiment, the plurality of metallic nanofibers may have an aspect ratio between about 500:1 to 100:1, for example and without limitation. In various other exemplary embodiments, the plurality of metallic nanofibers may have an aspect ratio between about 400:1 to 200:1; an aspect ratio between about 350:1 to 250:1; and/or an aspect ratio between about 350:1 to 275:1, all also for example and without limitation. With the length dimension substantially greater than the diameter (or width) dimension, such as having lengths 10 to about 6000 times greater than the diameter, the exemplary metallic nanofibers 100 have some rigidity but are also flexible, which aids in the creation of electrical contacts with each other to form a conductive film, trace or line, in any form factor, and to facilitate the creation of electrical contacts with other system components, such as diodes, as illustrated in the related patent applications, to provide corresponding electrical connections to these other system components.

The dimensions of the exemplary metallic nanofibers 100 may be measured, for example, using a light microscope (which may also include measuring software). As additional examples, the dimensions of the exemplary metallic nanofibers 100 may be measured using, for example, a scanning electron microscope (SEM), or Horiba's LA-920. The Horiba LA-920 instrument uses the principles of low-angle Fraunhofer Diffraction and Light Scattering to measure the particle size and distribution in a dilute solution of particles, such as when embodied in a metallic nanofiber ink. All particle sizes are measured in terms of their number average particle diameters and lengths, as there may be significant outliers in the fabrication of metallic nanofibers.

The exemplary metallic nanofibers 100 may be comprised of a wide variety of materials, and a referred to as "metallic" to indicate substantially high conductivity. In an exemplary embodiment, metallic nanofibers 100 are comprised of one or more metals (e.g., aluminum, copper, silver, gold, nickel, palladium, tin, platinum, lead, zinc, etc.), alone or in combination with each other, such as an alloy, for example and without limitation. Combinations of different types of conductors and/or conductive compounds or materials (e.g., ink, polymer, carbon nanotubes, elemental metal, etc.) may also be utilized to form metallic nanofibers 100. Multiple layers and/or types of metal or other conductive materials may be combined to form the metallic nanofibers 100.

As illustrated in FIG. 5, the exemplary metallic nanofibers 100 may also be functionalized with a wide variety of compounds to aid their dispersion in a liquid or gel. In an exemplary embodiment, metallic nanofibers 100 are functionalized by having a complete or full coating, a substantial coating, or at least a partial coating 125 of a polymer, including a pyrrolidone polymer such as polyvinyl pyrrolidone ("PVP") or any other polymer, for example and without limitation, such as to facilitate dispersion of the metallic nanofibers 100 in the metallic nanofiber ink, also for example.

The exemplary metallic nanofibers 100 may be fabricated using any fabrication techniques which are known currently or which are developed in the future. Exemplary metallic nanofibers 100, such as silver nanofibers, including metallic nanofibers in a functionalized form with PVP coatings, are commercially available and have been obtained from several suppliers, including NanoGap Subnmparticles of Spain, US and UK and having an office in San Francisco, California USA; Blue Nano Inc. of Charlotte and Cornelius, North Carolina USA; Zhejiang Kechuang Advanced Materials Technology Co. Ltd. of Zhejiang, China; and ACS Material LLC, having offices in Medford, Massachusetts and Ames, Iowa, USA. For example, metallic nanofibers 100 exemplary include AW030 silver fibers obtained from Zhejiang Kechuang Advanced Materials Technology Co. Ltd.

Metallic Nanofiber Ink Example 1

A composition comprising:
a plurality of functionalized metallic nanofibers, substantially all of the metallic nanofibers having at least a partial coating of a polymer;
a solvent; and
a viscosity modifier.

Metallic Nanofiber Ink Example 2

A composition comprising:
a plurality of functionalized metallic nanofibers, substantially all of the metallic nanofibers having at least a partial coating of a polymer;
a solvating agent; and
a viscosity modifier.

Metallic Nanofiber Ink Example 3

A composition comprising:
a plurality of functionalized metallic nanofibers, substantially all of the metallic nanofibers having at least a partial coating of a polymer;
a wetting or rewetting solvent; and
a viscosity modifier.

Metallic Nanofiber Ink Example 4

A composition comprising:
a plurality of functionalized metallic nanofibers, substantially all of the metallic nanofibers having at least a partial coating of a polymer;
a first solvent;
a first viscosity modifier; and
a second, adhesion promoting solvent or a second, adhesive viscosity modifier.

Metallic Nanofiber Ink Example 5

A composition comprising:
a plurality of functionalized metallic nanofibers, substantially all of the metallic nanofibers having at least a partial coating of a polymer;
a first solvent having a comparatively high melting point and comprising a solid at room temperature (about 25° C.);
a first viscosity modifier;
a second, adhesion promoting solvent or a second, adhesive viscosity modifier; and
a third solvent to lower the melting point and liquefy the first solvent at room temperature (about 25° C.).

Metallic Nanofiber Ink Example 6

A composition comprising:
a plurality of functionalized metallic nanofibers, substantially all of the metallic nanofibers having at least a partial coating of a polyvinyl pyrrolidone polymer and having lengths between about 40μ and about 60μ and diameters between about 25 nm and about 35 nm;
a first solvent having a comparatively high melting point and comprising a solid at room temperature (about 25° C.);
a viscosity modifier;
a second, adhesion promoting solvent; and
a third solvent to lower the melting point and liquefy the first solvent at room temperature (about 25° C.).

Metallic Nanofiber Ink Example 7

A composition comprising:
a plurality of functionalized metallic nanofibers, substantially all of the metallic nanofibers having at least a partial coating of a polyvinyl pyrrolidone polymer;
a first solvent comprising cyclohexanol or cyclohexanone;
a viscosity modifier comprising polyvinyl pyrrolidone or a polyimide;
a second, adhesion promoting solvent comprising acetic acid; and
a third solvent comprising 1-butanol, n-methylpyrrolidone or cyclopentanone.

In various exemplary embodiments, such as in Examples 1-7 and the additional Examples below, a metallic nanofiber ink comprises a plurality of functionalized metallic nanofibers 100, each or most having at least a partial coating of a polymer such as PVP, and which are dispersed in a solvent (such as cyclohexanol, 1-butanol, n-methylpyrrolidone, cyclohexanone, cyclopentanone, acetic acid, ethanol, 1-pentanol or 1-hexanol) and a viscosity modifier, such as PVP. One or more solvents (as first, second or third solvents) may be used equivalently, for example and without limitation: water; alcohols such as methanol, ethanol, N-propanol (including 1-propanol, 2-propanol (isopropanol or IPA), 1-methoxy-2-propanol), butanol (including 1-butanol, 2-butanol (isobutanol)), pentanol (including 1-pentanol, 2-pentanol, 3-pentanol), hexanol (including 1-hexanol, 2-hexanol, 3-hexanol), octanol, N-octanol (including 1-octanol, 2-octanol, 3-octanol), tetrahydrofurfuryl alcohol (THFA), cyclohexanol, cyclopentanol, terpineol; lactones such as butyl lactone; ethers such as methyl ethyl ether, diethyl ether, ethyl propyl ether, and polyethers; ketones, including diketones and cyclic ketones, such as cyclohexanone, cyclopentanone, cycloheptanone, cyclooctanone, acetone, benzophenone, acetylacetone, acetophenone, cyclopropanone, isophorone, methyl ethyl ketone; esters such ethyl acetate, dimethyl adipate, proplyene glycol monomethyl ether acetate, dimethyl glutarate, dimethyl succinate, glycerin acetate, carboxylates; glycols such as ethylene glycols, diethylene glycols, polyethylene glycols, propylene glycols, dipropylene glycols, glycol ethers, glycol ether acetates; carbonates such as propylene carbonate; glycerols such as glycerin; n-methylpyrrolidone, acetonitrile, tetrahydrofuran (THF), dimethyl formamide (DMF), N-methyl formamide (NMF), dimethyl sulfoxide (DMSO); acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof. In addition, a solvent may also function as a viscosity modifier and vice-versa, such as cyclohexanol, terpineol and n-methyl pyrrolidone, for example and without limitation.

In various exemplary embodiments, the selection of a first (or second) solvent is based upon at least two properties or characteristics. A first characteristic of the solvent is its ability be soluble in or to solubilize a binder, a viscosity modifier or an adhesive viscosity modifier such as PVP, PVA, methoxy cellulose or hydroxy propyl methylcellulose resin. A second characteristic or property is its evaporation rate, which should be slow enough to allow sufficient screen residence (for screen printing) of the metallic nanofiber ink or to meet other printing parameters. In various exemplary embodiments, an exemplary evaporation rate is less than one (<1, as a relative rate compared with butyl acetate), or more specifically, between 0.0001 and 0.9999.

One or more viscosity modifiers, binders, resins or thickeners (as a viscosity modifier) may be used, for example and without limitation: polymers (or equivalently, polymeric precursors or polymerizable precursors) such as polyvinyl pyrrolidone (also referred to or known as polyvinyl pyrrolidinone), polyvinyl alcohol, polyimide polymers and copolymers (including aliphatic, aromatic and semi-aromatic polyimides), acrylate and (meth)acrylate polymers and copolymers; glycols such as ethylene glycols, diethylene glycol, polyethylene glycols, propylene glycols, dipropylene glycols, glycol ethers, glycol ether acetates; clays such as hectorite clays, garamite clays, organo-modified clays; saccharides and polysaccharides such as guar gum, xanthan gum; celluloses and modified celluloses such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxyl ethylcellulose, cellulose ether, cellulose ethyl ether, chitosan; fumed silica (such as Cabosil), silica powders and modified ureas such as BYK® 420 (available from BYK Chemie GmbH); and mixtures thereof. As mentioned above, some of the viscosity modifiers may also function as solvents and vice-versa, such as the various glycols, and therefore are included in the various listings of exemplary solvents and viscosity modifiers. In several Examples discussed below, E-3 and E-10 cellulose resins available from The Dow Chemical Company (www.dow.com) and Hercules Chemical Company, Inc. (www.herchem.com) are utilized. In an exemplary embodiment, the PVP utilized has a molecular weight between about 50,000 to about 3 million MW, or more particularly between about 100,000 to 2 million MW, or more particularly between about 500,000 to 1.5 million MW, or more particularly between about 750,000 to 1.25 million MW, while the PVA has a molecular weight of about 133K, or more generally between about 50,000 to 250K MW, and may be obtained from Polysciences, Inc. of Warrington, Pennsylvania USA. Other viscosity modifiers may be used, as well as particle addition to control viscosity, as described in Lewis et al., Patent Application Publication Pub. No. US 2003/0091647. Other viscosity modifiers or binders may also be utilized. As mentioned above, the metallic nanofibers 100 are functionalized with a substantial, complete or at least a partial coating of polyvinyl pyrrolidone (PVP) having a molecular weight between about 5,000 to about 50,000 MW.

Referring to Metallic Nanofiber Ink Examples 1-7 and the additional Examples described below, there are a wide variety of exemplary metallic nanofiber ink compositions within the scope of the present disclosure. Generally, as in Example 1, a liquid suspension of metallic nanofibers 100 comprises a plurality of functionalized metallic nanofibers 100, a first solvent (such as 1-butanol, ethanol, 1-pentanol, n-methylpyrrolidone, cyclohexanone, 1-hexanol, acetic acid, or other solvents discussed herein), which also may be an adhesion promoting solvent as in Examples 5-7, and a viscosity modifier, resin or binder (such those discussed above, which may also be an adhesive viscosity modifier, resin or binder as in Example 5); and as in Examples 2 and 3, a liquid suspension of metallic nanofibers 100 comprises a plurality of functionalized metallic nanofibers 100, a solvating agent or a wetting or rewetting solvent (such as one of the second solvents discussed herein), and a viscosity modifier, resin or binder. More particularly, such as in Examples 4-7, a liquid suspension of metallic nanofibers 100 comprises a plurality of functionalized metallic nanofibers 100, a first solvent (such as 1-butanol, ethanol, 1-pentanol, n-methylpyrrolidone, cyclohexanone, 1-hexanol, or acetic acid), a viscosity modifier, resin or binder (or equivalently, a viscous compound, a viscous resin, a viscous agent, a viscous polymer, a viscous resin, a viscous binder, a thickener, and/or a rheology modifier) such as PVP or a polyimide, and a second, adhesion promoting solvent or a second, adhesive viscosity modifier, to provide a metallic nanofiber ink having a viscosity between about 100 centipoise (cps) and 20,000 cps at room temperature (about 25° C.), or more preferably between about 200-1000 centipoise (cps) cps at room temperature (about 25° C.), or more preferably between about 400-600 centipoise (cps) cps at room temperature (about 25° C.) for a screen printable ink (or between about 500 cps to 60,000 cps at a refrigerated temperature (e.g., 5-10° C.)). Depending upon the viscosity, the resulting composition may be referred to equivalently as a liquid or as a gel suspension of metallic nanofibers, and any reference to liquid or gel herein shall be understood to mean and include the other.

In addition, the resulting viscosity of the metallic nanofiber ink will generally vary depending upon the type of printing process to be utilized and may also vary depending upon the metallic nanofiber composition and size. For example, a metallic nanofiber ink for screen printing may have a viscosity between about 100 centipoise (cps) and 25,000 cps at room temperature, or more specifically between about 200 centipoise (cps) and 5,000 cps at room temperature, or more specifically between about 200 centipoise (cps) and 1,000 cps at room temperature, or more specifically between about 300 centipoise (cps) and 800 cps at room temperature, or more specifically between about 400 centipoise (cps) and 600 cps at room temperature, or more specifically between about 450 centipoise (cps) and 550 cps at room temperature. Also for example, a metallic nanofiber ink for flexographic printing may have a viscosity between about 100 centipoise (cps) and 10,000 cps at room temperature, or more specifically between about 200 centipoise (cps) and 4,000 cps at room temperature, or more specifically between about 500 centipoise (cps) and 3,000 cps at room temperature, or more specifically between about 1,800 centipoise (cps) and 2,200 cps at room temperature, or more specifically between about 2,000 centipoise (cps) and 6,000 cps at room temperature, or more specifically between about 2,500 centipoise (cps) and 4,500 cps at room temperature, or more specifically between about 2,000 centipoise (cps) and 4,000 cps at room temperature.

Viscosity may be measured in a wide variety of ways. For purposes of comparison, the various specified and/or claimed ranges of viscosity herein have been measured using a Brookfield viscometer (available from Brookfield Engineering Laboratories of Middleboro, Massachusetts, USA) at a shear stress of about 200 pascals (or more generally between 190 and 210 pascals), in a water jacket at about 25° C., using a spindle SC4-27 at a speed of about 10 rpm (or more generally between 1 and 30 rpm, particularly for refrigerated fluids, for example and without limitation).

Referring to Metallic Nanofiber Ink Examples 4-7, the liquid suspension of metallic nanofibers 100 may further comprise a second, adhesion promoting solvent or a second, adhesive viscosity modifier, namely, any of the solvents or viscosity modifiers mentioned above which have the additional property of adhesion promotion, including modification of a substrate surface to allow or promote adherence of the metallic nanofiber ink and resulting film or trace (150). Such an adhesion promoting solvent or adhesive viscosity modifier may provide for any of the following: adhering the metallic nanofibers 100 to another conductor (e.g., a diode contact); adhering the film or trace (150) to a substrate (e.g., during device fabrication (e.g., printing)) such as plastic, glass, silicon, polyethylene terephthalates (PET), polycarbonate, polymethyl methacrylate (PMMA), etc.; and/or an infrastructure (e.g., polymeric) (when dried or cured) for holding the metallic nanofibers 100 in place in an apparatus (150, 150A). While providing such adhesion, such a viscosity modifier, resin or binder should also have some capability to de-wet from inter-fiber contacts of the metallic nanofibers 100 to each other (i.e. to de-wet from the contact points between the various metallic nanofibers 100) and thereby help to decrease the sheet resistance of the apparatus 150. Such adhesive, viscosity and de-wetting properties are among the reasons methoxyl cellulose or other cellulose resins have been utilized in various exemplary embodiments. In addition, such adhesion promoting to a substrate is also a reason a solvent such as acetic acid (or another acid or base) may be utilized in exemplary embodiments. Other suitable viscosity modifiers or binders may also be selected empirically.

Additional properties of the viscosity modifier, resin or binder are also useful and within the scope of the disclosure. First, such a viscosity modifier, resin or binder should prevent the suspended metallic nanofibers 100 from settling out or prevent hard caking of the metallic nanofibers 100 at a selected temperature, and potentially further allow comparatively easy redispersion of the metallic nanofibers 100 with minor agitation or stirring. Second, such a viscosity modifier, resin or binder should aid in printing the metallic nanofibers 100 in a uniform manner during apparatus (150, 150A) fabrication. Third, the viscosity modifier, resin or binder may also serve to cushion or otherwise protect the metallic nanofibers 100 during the printing process. Referring to Examples 2-7, the liquid suspension of metallic nanofibers 100 may further comprise a second solvent (Examples 4-7) or a solvating agent or a wetting solvent (Examples 2 and 3), with many examples discussed in greater detail below. Such a (first or second) solvent is selected as a wetting (equivalently, solvating) or rewetting agent or adhesion promoting for facilitating ohmic or electrical contact between metallic nanofibers 100 and other devices, such as diodes or transistors, and between the metallic nanofibers 100 themselves, also for example and without limitation.

The balance of the liquid or gel suspension of metallic nanofibers 100 is generally another, second solvent, such as cyclohexanol, cyclohexanone, cyclopentanone and/or a third solvent (or fourth or more solvents), such as 1-butanol, n-methylpyrrolidone, or deionized water, and any descriptions of percentages herein shall assume that the balance of the liquid or gel suspension of metallic nanofibers 100 is such a second, third or fourth solvent such as cyclohexanol, cyclohexanone, cyclopentanone, n-methylpyrrolidone, 1-butanol or water, and all described percentages are based on weight, rather than volume or some other measure. It should also be noted that the various metallic nanofiber ink suspensions may all be mixed in a typical atmospheric setting, without requiring any particular composition of air or other contained or filtered environment.

Solvent selection may also be based upon the polarity of the solvent. In an exemplary embodiment, a first solvent such as an alcohol may be selected as a polar or hydrophilic solvent, to facilitate de-wetting off of the metallic nanofibers 100 and other conductors during apparatus 150, 150A, fabrication, while concomitantly being able to be soluble in or solubilize a viscosity modifier.

Another useful property of an exemplary metallic nanofiber ink is that the dried or cured metallic nanofiber ink is substantially clear at visible wavelengths, to substantially allow or not interfere with the emission of visible light generated by devices such as LEDs. Various transmissivity percentages and corresponding sheet resistances for different densities of metallic nanofibers 100 are provided in Table I below and illustrated in FIG. 7.

Another way to characterize an exemplary metallic nanofiber ink is based upon the size of the metallic nanofibers 100, as discussed above. As illustrated in Example 6, the metallic nanofibers 100 generally may be between about 40-60 microns in length, and have a diameter between about 25 nm to about 35 nm. Additional size ranges also may be provided as previously discussed.

The metallic nanofiber ink may also be characterized by its electrical properties. For example, the metallic nanofibers 100 may be suspended in at least one substantially non-insulating carrier or solvent, in contrast with an insulating binder, for example.

Metallic Nanofiber Ink Example 8

A composition comprising:
a plurality of metallic nanofibers, substantially all of the metallic nanofibers having at least a partial coating of polyvinyl pyrrolidone;
a first solvent comprising about 1% to 10% 1-butanol, ethanol, 1-pentanol, n-methylpyrrolidone, 1-hexanol, or acetic acid, or mixtures thereof;
a viscosity modifier, resin, or binder comprising about 0.75% to 5.0% PVP, polyvinyl alcohol, or a polyimide, or mixtures thereof; and
with the balance comprising a second solvent such as cyclohexanol, cyclohexanone, cyclopentanone, cyclopentanol, butyl lactone, or mixtures thereof.

Metallic Nanofiber Ink Example 9

A composition comprising:
about 0.01% to 3.0% of a plurality of functionalized metallic nanofibers, substantially all of the metallic nanofibers having at least a partial coating of a polyvinyl pyrrolidone polymer;
a first solvent comprising about 2.5% to 8% 1-butanol, ethanol, 1-pentanol, n-methylpyrrolidone, 1-hexanol, or acetic acid, or mixtures thereof;
a viscosity modifier, resin, or binder comprising about 1.0% to 4.5% PVP, polyvinyl alcohol, or a polyimide, or mixtures thereof; and
with the balance comprising a second solvent such as cyclohexanol, cyclohexanone, cyclopentanone, cyclopentanol, butyl lactone, or mixtures thereof.

Metallic Nanofiber Ink Example 10

A composition comprising:
about 0.01% to 3.0% of a plurality of functionalized metallic nanofibers, substantially all of the metallic nanofibers having at least a partial coating of a polyvinyl pyrrolidone polymer;
a first solvent comprising about 2.5% to 8% 1-butanol, ethanol, 1-pentanol, n-methylpyrrolidone, or 1-hexanol, or mixtures thereof;
a second solvent comprising about 0.01% to 5% of an acid or base, or mixtures thereof;
a viscosity modifier, resin, or binder comprising about 1.0% to 4.5% PVP, polyvinyl alcohol, or a polyimide, or mixtures thereof; and
with the balance comprising a third solvent such as cyclohexanol, cyclohexanone, cyclopentanone, cyclopentanol, butyl lactone, or mixtures thereof.

Metallic Nanofiber Ink Example 11

A composition comprising:
about 0.01% to 3.0% of a plurality of functionalized metallic nanofibers, substantially all of the metallic nanofibers having at least a partial coating of a polyvinyl pyrrolidone polymer;
a first solvent comprising about 2.5% to 8% of a first alcohol;
a second solvent comprising about 0.01% to 5% of an acid or base, or mixtures thereof;
a viscosity modifier, resin, or binder comprising about 1.0% to 4.5% PVP, polyvinyl alcohol, or a polyimide, or mixtures thereof; and with the balance comprising a second alcohol different from the first alcohol.

Metallic Nanofiber Ink Example 12

A composition comprising:
about 0.01% to 3.0% of a plurality of functionalized metallic nanofibers, substantially all of the metallic nanofibers having at least a partial coating of a polyvinyl pyrrolidone polymer;
a first solvent comprising about 2.5% to 8% 1-butanol, ethanol, 1-pentanol, n-methylpyrrolidone, or 1-hexanol, or mixtures thereof;
a second solvent comprising about 0.01% to 5% of an acid or bases, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid, or bases such as ammonium hydroxide, sodium hydroxide, potassium hydroxide, or mixtures thereof;
a viscosity modifier, resin, or binder comprising about 1.0% to 4.5% PVP, polyvinyl alcohol, or a polyimide, or mixtures thereof; and
with the balance comprising a third solvent such as cyclohexanol, cyclohexanone, cyclopentanone, cyclopentanol, butyl lactone, or mixtures thereof.

Metallic Nanofiber Ink Example 13

A composition comprising:
about 0.18% to 0.3% of a plurality of functionalized metallic nanofibers, substantially all of the metallic nanofibers having at least a partial coating of a polyvinyl pyrrolidone polymer;
about 2.5% to 8% of 1-butanol;
about 0.1% to 2% of acetic acid;
about 1.0% to 4.5% polyvinyl pyrrolidone; and
with the balance comprising cyclohexanol, cyclohexanone, cyclopentanone, cyclopentanol, or butyl lactone, or mixtures thereof.

Metallic Nanofiber Ink Example 14

A composition comprising:
about 0.01% to 3.0% of a plurality of functionalized metallic nanofibers;
a first solvent comprising about 3% to 28% 1-butanol, ethanol, 1-pentanol, n-methylpyrrolidone, or 1-hexanol, or mixtures thereof;
a viscosity modifier, resin, or binder comprising about 1.4% to 3.75% PVP, polyvinyl alcohol, or a polyimide, or mixtures thereof; and
with the balance comprising a second solvent such as cyclohexanol, cyclohexanone, cyclopentanone, cyclopentanol, butyl lactone, or mixtures thereof.

Metallic Nanofiber Ink Example 15

A composition comprising:
about 0.01% to 3.0% of a plurality of functionalized metallic nanofibers;
a first solvent comprising about 3.0% to 7% 1-butanol, ethanol, 1-pentanol, n-methylpyrrolidone, 1-hexanol, or acetic acid, or mixtures thereof;
a viscosity modifier, resin, or binder comprising about 1.4% to 3.75% PVP, polyvinyl alcohol, or a polyimide, or mixtures thereof;
a second solvent comprising about 0.001% to 2% of 1-octanol, acetic acid, diethylene glycol, dipropylene glycol, propylene glycol, potassium hydroxide or sodium hydroxide, or mixtures thereof; and
with the balance comprising a third solvent such as cyclohexanol, cyclohexanone, cyclopentanone, cyclopentanol, butyl lactone, or mixtures thereof.

Metallic Nanofiber Ink Example 16

A composition comprising:
about 0.01% to 3.0% of a plurality of functionalized metallic nanofibers;
a first solvent comprising about 2.5% to 28% 1-butanol, ethanol, 1-pentanol, 1-hexanol, acetic acid, 2-propanol (isopropyl alcohol or IPA), 1-methoxy-2-propanol, diethylene glycol, or mixtures thereof;
a viscosity modifier, resin, or binder comprising about 0.05% to 5.0% cellulose resin such as hydroxy methylcellulose, methylcellulose, ethyl cellulose, propyl methylcellulose, methoxy cellulose, methoxy methylcellulose, methoxy propyl methylcellulose, hydroxy propyl methylcellulose, carboxy methylcellulose, hydroxy ethylcellulose, ethyl hydroxyl ethylcellulose, or mixtures thereof;
a second solvent comprising about 5% to 50% of n-propanol, 2-propanol, propylene glycol, or diethylene glycol, or mixtures thereof; and
with the balance comprising a third solvent such as 1-methoxy-2-propanol, cyclohexanol, cyclohexanone, cyclopentanone, cyclopentanol, butyl lactone, or mixtures thereof.

Metallic Nanofiber Ink Example 17

A composition comprising:
about 0.01% to 3.0% of a plurality of functionalized metallic nanofibers 100;
a first solvent comprising about 18% to 28% 2-propanol (isopropyl alcohol or IPA), 1-methoxy-2-propanol, 1-butanol, ethanol, diethylene glycol, 1-pentanol or 1-hexanol, or mixtures thereof;
a viscosity modifier, resin, or binder comprising about 1.5% to 2.5% cellulose resin such as propoxymethyl cellulose, methoxyl cellulose or hydroxypropyl cellulose resin, or mixtures thereof;
a second solvent comprising about 15% to 25% of n-propanol, 2-propanol, or diethylene glycol, or mixtures thereof; and
with the balance comprising a third solvent such as (deionized) water, 1-methoxy-2-propanol, cyclohexanol, cyclohexanone, cyclopentanone, cyclopentanol, butyl lactone, or mixtures thereof.

Metallic Nanofiber Ink Example 18

A composition comprising:
about 0.01% to 3.0% of a plurality of functionalized metallic nanofibers 100;
a first solvent comprising about 2.0% to 10.0% n-methylpyrrolidone, 2-propanol (isopropyl alcohol or IPA), 1-methoxy-2-propanol,1-butanol, ethanol, diethylene glycol, 1-pentanol, n-methylpyrrolidone, or 1-hexanol, or mixtures thereof.

a first viscosity modifier, resin, or binder comprising about 0.75% to 5.0% PVP, polyvinyl alcohol, or a polyimide, or mixtures thereof;
a second viscosity modifier, resin, or binder comprising about 7% to 12% alpha-terpineol;
a second solvent comprising about 1% to 5% of n-propanol, 2-propanol, or diethylene glycol, or mixtures thereof; and
with the balance comprising a third solvent such as n-methylpyrrolidone, cyclohexanol, cyclohexanone, cyclopentanone, cyclopentanol, butyl lactone, or mixtures thereof.

Metallic Nanofiber Ink Example 19

A composition comprising:
about 0.01% to 3.0% of a plurality of functionalized metallic nanofibers 100;
a first solvent comprising about 18% to 28% n-methyl pyrrolidone, 2-propanol (isopropyl alcohol or IPA), 1-methoxy-2-propanol, 1-butanol, ethanol, diethylene glycol, 1-pentanol, n-methylpyrrolidone, or 1-hexanol, or mixtures thereof;
a first viscosity modifier, resin, or binder comprising about 0.75% to 5.0% PVP, polyvinyl alcohol (PVA), or a polyimide, or mixtures thereof (e.g., about 60% PVA with 40% PVP or about 80% PVA with 20% PVP in n-methyl pyrrolidone); and
with the balance comprising a second solvent such as n-methyl pyrrolidone, cyclohexanol, cyclohexanone, cyclopentanone, cyclopentanol, butyl lactone, or mixtures thereof.

Metallic Nanofiber Ink Example 20

A composition comprising:
about 0.01% to 3.0% of a plurality of functionalized metallic nanofibers, substantially all of the metallic nanofibers having at least a partial coating of a polyvinyl pyrrolidone polymer;
a first solvent comprising about 2.5% to 8% 1-butanol, ethanol, 1-pentanol, n-methylpyrrolidone, or 1-hexanol, or mixtures thereof;
a second solvent comprising about 0.01% to 5% of acetic acid, nitric acid, sulfuric acid, hydrochloric acid, hydrofluoric acid, ammonium hydroxide, sodium hydroxide, or potassium hydroxide, or mixtures thereof;
a viscosity modifier, resin, or binder comprising about 1.0% to 4.5% PVP, polyvinyl alcohol, or a polyimide, or mixtures thereof; and
with the balance comprising a third solvent such as cyclohexanol, cyclohexanone, cyclopentanone, cyclopentanol, butyl lactone, or mixtures thereof;
wherein the viscosity of the composition is substantially between about 200 cps to about 20,000 cps at 25° C.

Metallic Nanofiber Ink Example 21

A composition comprising:
about 0.01% to 3.0% of a plurality of functionalized metallic nanofibers, substantially all of the metallic nanofibers having at least a partial coating of a polyvinyl pyrrolidone polymer and having lengths between about 40μ and about 60μ and diameters between about 25 nm and about 35 nm;
a plurality of metallic particles about 20-30 nm in any dimension;
a first solvent comprising about 2.5% to 8% 1-butanol, ethanol, 1-pentanol, n-methylpyrrolidone, or 1-hexanol, or mixtures thereof;
a second solvent comprising about 0.01% to 5% of an acid or base, or mixtures thereof;
a viscosity modifier, resin, or binder comprising about 1.0% to 4.5% PVP, polyvinyl alcohol, or a polyimide, or mixtures thereof; and
with the balance comprising a third solvent such as cyclohexanol, cyclohexanone, cyclopentanone, cyclopentanol, butyl lactone, or mixtures thereof.

Metallic Nanofiber Ink Example 22

A composition comprising:
about 0.01% to 3.0% of a plurality of functionalized metallic nanofibers, substantially all of the metallic nanofibers having at least a partial coating of a polyvinyl pyrrolidone polymer;
a plurality of carbon nanotubes;
a first solvent comprising about 2.5% to 8% 1-butanol, ethanol, 1-pentanol, n-methylpyrrolidone, or 1-hexanol, or mixtures thereof;
a second solvent comprising about 0.01% to 5% of acetic acid, nitric acid, sulfuric acid, hydrochloric acid, hydrofluoric acid, ammonium hydroxide, sodium hydroxide, or potassium hydroxide, or mixtures thereof;
a viscosity modifier, resin, or binder comprising about 1.0% to 4.5% PVP, polyvinyl alcohol, or a polyimide, or mixtures thereof; and
with the balance comprising a third solvent such as cyclohexanol, cyclohexanone, cyclopentanone, cyclopentanol, butyl lactone, or mixtures thereof.

Metallic Nanofiber Ink Example 23

A composition comprising:
about 0.01% to 3.0% of a plurality of functionalized metallic nanofibers, substantially all of the metallic nanofibers having at least a partial coating of a polyvinyl pyrrolidone polymer;
about 0.5% to 5.0% polyimide; and
with the balance comprising a ketone, including diketones and cyclic ketones, such as cyclohexanone, cyclopentanone, cycloheptanone, cyclooctanone, acetone, benzophenone, acetylacetone, acetophenone, cyclopropanone, isophorone, methyl ethyl ketone, or mixtures thereof.

Metallic Nanofiber Ink Example 24

A composition comprising:
about 0.01% to 3.0% of a plurality of functionalized metallic nanofibers, substantially all of the metallic nanofibers having at least a partial coating of a polyvinyl pyrrolidone polymer;
about 1.0% to 4.5% polyimide; and
with the balance comprising cyclohexanone.

Referring to Metallic Nanofiber Ink Examples 8-24, in an exemplary embodiment, a plurality of (functionalized) metallic nanofibers 100 are suspended in a first solvent, such as 1-butanol, ethanol, 1-pentanol, 1-hexanol, 2-propanol (isopropyl alcohol or IPA), 1-methoxy-2-propanol, cyclohexanol, cyclohexanone, cyclopentanone, cyclopentanol, butyl lactone, diethylene glycol, or n-methyl pyrrolidone, other solvents discussed above, or mixtures thereof, such that the functionalized metallic nanofibers 100 typically comprise between about 3% to 10% by weight of this intermediate mixture, e.g., 4% to 5% by weight metallic nanofibers 100 suspended in a solvent mixture comprising about 80% cyclohexanol and about 20% 1-butanol. A first or second solvent may then be added to further reduce the percentage (by weight) of functionalized metallic nanofibers 100 by about 50-75%, to between about 0.01% to 3.0% functionalized metallic nanofibers 100. A third solvent such as acetic acid may also be added. A viscosity modifier, resin or binder comprising about 1.0% to 8.5% PVP, polyvinyl alcohol, or a polyimide is dissolved in a first or second solvent (such as cyclohexanol, cyclohexanone, cyclopentanone, cyclopentanol, butyl lactone, 1-butanol, ethanol, 1-pentanol or 1-hexanol, ther viscosity modifiers, resins or binders discussed above, or mixtures thereof), typically at 80-90° C. with an impeller or stirring bead, then allowed to cool to room temperature. (For consistency between batches, the PVP is typically heated and dessicated prior to use, and is reflected in all PVP weight percentages described herein). The metallic nanofibers 100 in the first (or second) solvent are then added to the viscosity modifier, resin or binder mixture, mixing with a helical impeller for 3 to 10 minutes, depending on the batch size, at a moderate speed to avoid damaging the metallic nanofibers 100, at standard atmospheric pressure and at room temperature (about 25° C.), which further serves to avoid any harm or damage to the PVP functionalization of the metallic nanofibers 100.

A particular advantage of this formulation using cyclohexanol and 1-butanol is that the various percentages of metallic nanofibers 100 and solvents such as 1-butanol may be adjusted independently of the other.

The viscosity modifier, resin or binder provides sufficient viscosity for the metallic nanofibers 100 that they are substantially maintained in suspension and do not settle out of the liquid or gel suspension, particularly under refrigeration.

A second or third (or fourth) solvent such as deionized water also may be added, to adjust the relative percentages and reduce viscosity, as may be necessary or desirable. In addition, other first, second or third solvents which may be utilized equivalently include, for example and without limitation, water; alcohols such as methanol, ethanol, N-propanol (including 1-propanol, 2-propanol (isopropanol or IPA), 1-methoxy-2-propanol), butanol (including 1-butanol, 2-butanol (isobutanol)), pentanol (including 1-pentanol, 2-pentanol, 3-pentanol), hexanol (including 1-hexanol, 2-hexanol, 3-hexanol), octanol, N-octanol (including 1-octanol, 2-octanol, 3-octanol), tetrahydrofurfuryl alcohol (THFA), cyclohexanol, cyclopentanol, terpineol; lactones such as butyl lactone; ethers such as methyl ethyl ether, diethyl ether, ethyl propyl ether, and polyethers; ketones, including diketones and cyclic ketones, such as cyclohexanone, cyclopentanone, cycloheptanone, cyclooctanone, acetone, benzophenone, acetylacetone, acetophenone, cyclopropanone, isophorone, methyl ethyl ketone; esters such ethyl acetate, dimethyl adipate, proplyene glycol monomethyl ether acetate, dimethyl glutarate, dimethyl succinate, glycerin acetate, carboxylates; glycols such as ethylene glycols, diethylene glycols, polyethylene glycols, propylene glycols, dipropylene glycols, glycol ethers, glycol ether acetates; carbonates such as propylene carbonate; glycerols such as glycerin; n-methylpyrrolidone, acetonitrile, tetrahydrofuran (THF), dimethyl formamide (DMF), N-methyl formamide (NMF), dimethyl sulfoxide (DMSO); acids, including organic acids such as carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; bases such as ammonium hydroxide, sodium hydroxide, potassium hydroxide; and mixtures thereof.

While generally the various metallic nanofiber inks are mixed in the order described above, it should also be noted that the various first solvent, viscosity modifier, second solvent, and third solvent (such as water) may be added or mixed together in other orders, any and all of which are within the scope of the disclosure.

Additional surfactants or non-foaming agents for printing may be utilized as an option, but are not required for proper functioning and exemplary printing.

Figure 6:
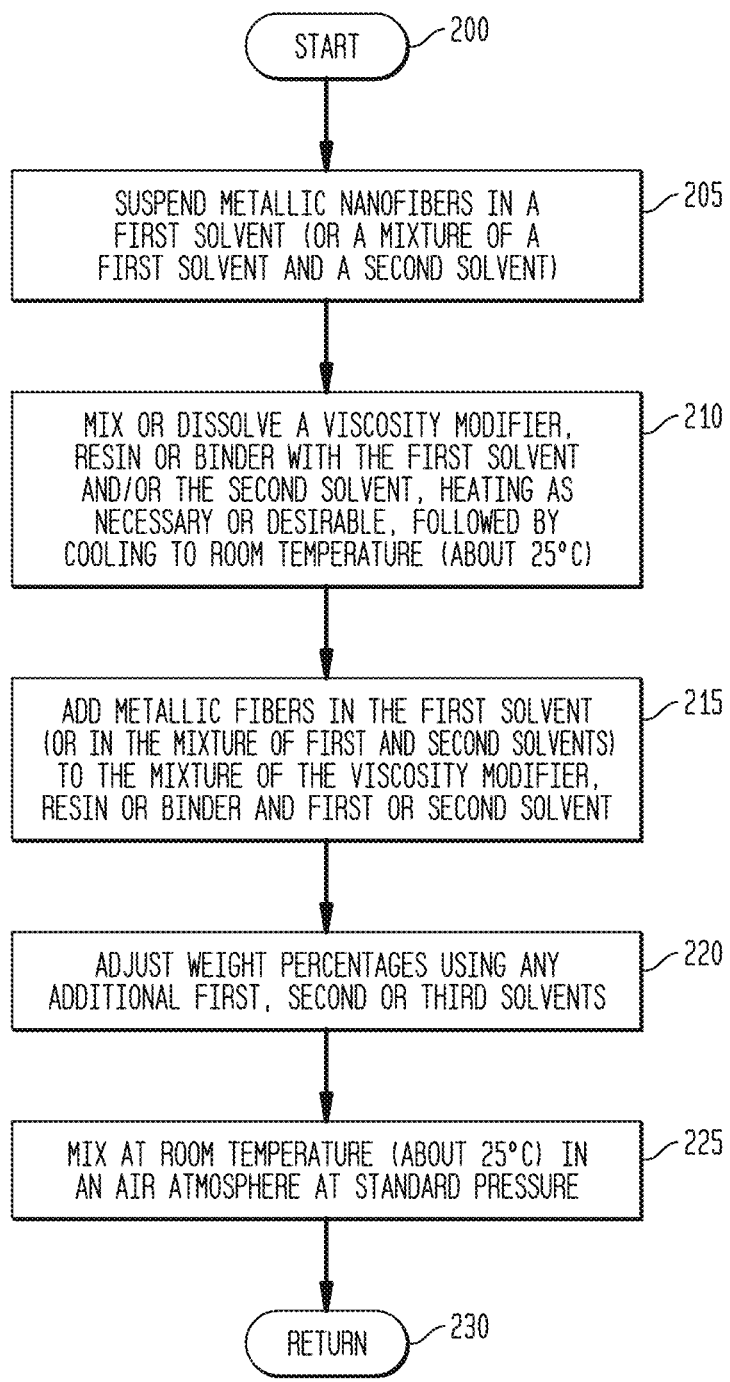
FIG. 6 is a flow diagram illustrating an exemplary method embodiment for metallic nanofiber ink fabrication.

FIG. 6 is a flow diagram illustrating an exemplary method embodiment for manufacturing metallic nanofiber ink, and provides a useful summary. The method begins, start step 200, with suspending or dispersing the metallic nanofibers 100 in a first solvent, step 205. A viscosity modifier or binder is then dissolved or mixed with a first or second solvent, step 210, heating as necessary or desirable, followed by cooling to room temperature (about 25° C.). The method then adds the metallic nanofibers 100 in the first solvent to the mixture of the viscosity modifier or binder and first or second solvent, step 215. Any weight percentages may be adjusted using a first, second or third solvent such as deionized water, step 220. In step 225, the method then mixes the plurality of metallic nanofibers 100, first solvent, viscosity modifier or binder, second solvent, and any additional first, second or third solvents for about 3-10 minutes at room temperature (about 25° C.) in an air atmosphere, with a resulting viscosity between about 200 cps to about 25,000 cps, e.g., 500 cps for screen printing. The method may then end, return step 230. It should also be noted that steps 205, 210, and 220 may occur in other orders, as described above, and may be repeated as needed, and that optional, additional mixing steps may also be utilized.

Additional components may also be included in the metallic nanofiber ink, such as CNTs or particulate materials. For example, in the embodiment of Example 21, metallic particles have also been added, such as silver nanoparticles having a size on the order of about 20-30 nm in any dimension, such as substantially spherical or oblong, available as 010 nanosilver from Ink Tec of Korea. When such particles are also included, the printed film (discussed below) may also be sintered as part of the curing process at about 130° C. to couple the particles to the metallic nanofibers 100. Also for example, in the embodiment of Example 22, carbon nanotubes have also been added, such as carbon nanotubes in a liquid carrier available from SouthWest NanoTechnologies, Inc., Norman, Oklahoma, USA. It should be noted that for added robustness, the various cured metallic nanofiber inks of the Examples may be overprinted with a stabilizing uv curable sealant of polymer as discussed below.

Dried or Cured Metallic Nanofiber Ink Example 1

A composition comprising:
a plurality of metallic nanofibers 100; and
a cured or polymerized resin or polymer.

Dried or Cured Metallic Nanofiber Ink Example 2

A composition comprising:
a plurality of metallic nanofibers 100;
a cured or polymerized resin or polymer; and
at least trace amounts of a solvent.

Dried or Cured Metallic Nanofiber Ink Example 3

A composition comprising:
a plurality of metallic nanofibers 100;
a cured or polymerized resin or polymer;
at least trace amounts of a solvent; and
at least trace amounts of a surfactant.

The metallic nanofiber ink may then be deposited in any pattern (e.g., as a sheet, conformal coating, lines or wires), such as through printing, to a wet film thickness of about 4μ-25μ, depending upon the type of printing or other deposition (such as screen or flexographic printing), and more preferably to about 16μ, such as through screen printing using a 280-500 mesh polyester, or PTFE-coated, or stainless steel screen having open areas large enough to permit substantially free passage of the longer metallic nanofibers 100 through the screen, and the volatile or evaporative components are dissipated, such as through a heating, uv cure, a radiation cure, or any drying process, for example and without limitation, to leave the metallic nanofibers 100 in the cured or polymerized resin or polymer. Depending upon the selected viscosity modifier, resin or polymer, curing of a polymer or polymerization of a polymer precursor may occur, and additionally may be crosslinked, such as by the addition of a crosslinking agent in the various exemplary compositions.

In an exemplary embodiment, the wet film is then cured or polymerized by heating for about 4-6 minutes, using a ramp cure, starting at about 65° C. to about 140-160° C., such as up to about 150° C. During such curing at these temperatures and with the exemplary combinations of solvents described above (e.g., cyclohexanol, cyclohexanone, cyclopentanone, 1-butanol, n-methylpyrrolidone), the PVP functionalization of the metallic nanofibers 100 dewets or pulls away from the metallic nanofibers 100, such that a sufficient number of the metallic nanofibers 100 form direct contacts with each other to form a conductive mesh and provide for sufficient conductivity at the various sheet resistances discussed and illustrated in Table 1 below, and further provide for electrical contacts with other system components, both generally without intervening or sandwiched PVP or other interference from the PVP coating on the metallic nanofibers 100. As a further consequence, the apparatus 150 does not require further processing, such as compression through nip rollers, to be sufficiently conductive with comparatively low sheet resistance while maintaining substantial transparency. The remaining dried or cured metallic nanofiber ink, as in Dried or Cured Metallic Nanofiber Ink Example 1, generally comprises a plurality of metallic nanofibers 100 and a cured or polymerized resin or polymer (which, as mentioned above, generally secures or holds the metallic nanofibers 100 in place). While the volatile or evaporative components (such as first and/or second solvents and/or surfactants) are substantially dissipated, trace or more amounts may remain, as illustrated in Dried or Cured Metallic Nanofiber Ink Examples 2 and 3. As used herein, a "trace amount" of an ingredient should be understood to be an amount greater than zero and less than or equal to 5% of the amount of the ingredient originally present in the metallic nanofiber ink when initially deposited.

Several novel, highly beneficial and synergistic effects have been empirically observed using the formulations of Examples 7-13 when cyclohexanol is used as a solvent and a comparatively high molecular weight PVP is utilized as the viscosity modifier, resin, or binder (e.g., 750,000 to 1.25 million MW). First, the use of cyclohexanol in the metallic nanofiber ink does not dissolve or otherwise remove the comparatively lower molecular weight PVP coating (functionalization) from the metallic nanofibers 100 at room temperature, but also does maintain the higher molecular weight PVP polymer in solution at room temperature. This promotes a long shelf life of the metallic nanofiber ink, as the PVP coating (functionalization) on the metallic nanofibers 100 serves to prevent the metallic nanofibers 100 from agglomerating, allowing comparatively easy redispersion after any settling during storage of the the metallic nanofiber ink, such as simply shaking the ink bottle or other container.

Second, at the elevated temperatures described above for curing the deposited metallic nanofiber ink, the cyclohexanol in the metallic nanofiber ink does dissolve or otherwise remove the comparatively lower molecular weight PVP coating (functionalization) from the metallic nanofibers 100, allowing the metallic nanofibers 100 to make direct contact with each other, without any intervening PVP, and thereby reducing the sheet resistance of the apparatus 150, 150A. Third, the cyclohexanol also helps to reduce or remove oxide formation on the surfaces of the metallic nanofibers 100, also enhancing the quality of the contacts of the metallic nanofibers 100 with each other. Fourth, during the cure process described above, the cured PVP (as the viscosity modifier, resin, or binder) tends to force the metallic nanofibers 100 together, also enhancing the inter-fiber contacts and reducing the sheet resistance of the apparatus 150, 150A.

Figure 7:
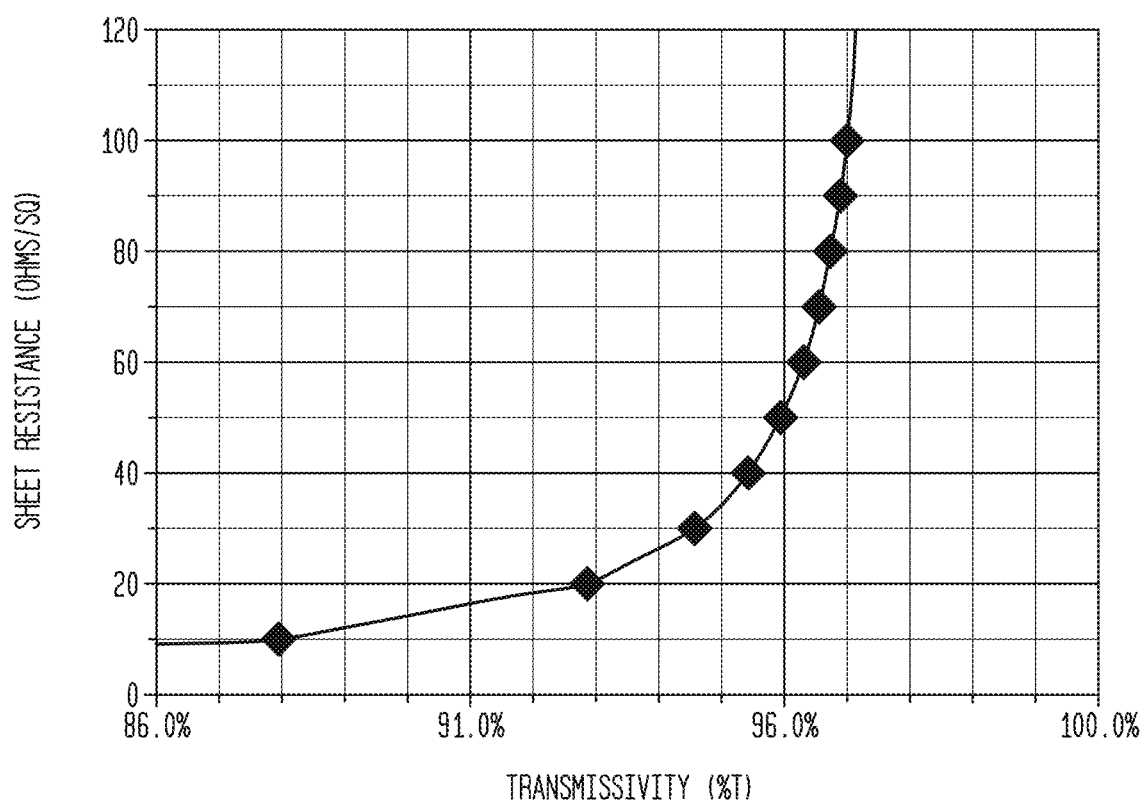
FIG. 7 is a graphical diagram illustrating sheet resistance and optical transmissivity for an exemplary apparatus embodiment fabricated with an exemplary metallic nanofiber ink.

The cured metallic nanofiber ink (forming an apparatus 150, 150A) results in a dried film thickness of between about 80 nm to about 300 nm, such as about 200 nm. For thicker optically transmissive, conductive films (150, 150A), additional layers of metallic nanofiber ink may be overprinted or otherwise deposited. An exemplary resistivity is about 15-60 ohms/square, with optical transmissivity from about 93% to over about 97%, depending on the formulation, with a higher percentage of metallic nanofibers 100 decreasing resistance but also decreasing optical transmissivity, as illustrated in Table 1, below. A graph of resistivity versus transmissivity is illustrated in FIG. 7, using these formulations based on Example 13, the AW030 metallic nanofibers mentioned above, and deposited using screen printing with a 305 mesh. It should be noted that the haze data in Table 1 is based upon a linear model model fit to measured haze data (rather than the actual or raw haze data).

TABLE 1

| Ohms/square | Optical Density | Metallic Nanofibers % Weight | Optical Transmissivity % | Haze % |
| --- | --- | --- | --- | --- |
| 5 | 0.103 | 0.94 | 78.8 | 29.7 |
| 10 | 0.056 | 0.51 | 87.9 | 16.4 |
| 20 | 0.032 | 0.29 | 92.9 | 9.2 |
| 30 | 0.024 | 0.22 | 94.6 | 6.7 |
| 40 | 0.020 | 0.18 | 95.5 | 5.5 |
| 50 | 0.018 | 0.16 | 96.0 | 4.7 |
| 60 | 0.016 | 0.15 | 96.3 | 4.2 |
| 70 | 0.015 | 0.14 | 96.6 | 3.8 |
| 80 | 0.014 | 0.13 | 96.8 | 3.6 |
| 90 | 0.014 | 0.12 | 96.9 | 3.4 |
| 100 | 0.013 | 0.12 | 97.0 | 3.2 |
| 150 | 0.012 | 0.10 | 97.4 | 2.7 |
| 200 | 0.011 | 0.10 | 97.6 | 2.4 |
| 400 | 0.010 | 0.09 | 97.8 | 2.0 |
| 800 | 0.009 | 0.09 | 98.0 | 1.8 |

As mentioned above, metallic nanofibers 100 may also be sonicated to break longer metallic nanofibers 100 into shorter metallic nanofibers 100. The resulting mixture of metallic nanofibers 100 having longer and shorter metallic nanofibers 100 may be utilized to produce better and more flexible surface coverage, and improve electrical contacts with other devices, such as diodes, for example.

The resulting substantially optically transmissive, conductive film, illustrated as apparatus 150, 150, typically comprises the metallic nanofibers 100 embedded in a binder, resin or polymer (resulting from the curing of the viscosity modifier, resin or binder), such as metallic nanofibers 100 embedded or emeshed with PVP, PVA or a polyimide, potentially also with residual or trace amounts of the other metallic nanofiber ink components, such as the various solvents or other additives mentioned above. The optically transmissive, conductive film (150, 150A) may then be overprinted as necessary or desirable, such as printing or deposition of additional layers or features, such as phosphors, stabilization or sealing layers (e.g., DuPont 5018 or Nazdar 3529 polymers), or other components, as discussed in greater detail below and in the related applications.

Any types of deposition processes may be utilized. As a consequence, as used herein, "deposition" includes any and all printing, coating, rolling, spraying, layering, sputtering, plating, spin casting (or spin coating), vapor deposition, lamination, affixing and/or other deposition processes, whether impact or non-impact, known in the art. "Printing" includes any and all printing, coating, rolling, spraying, layering, spin coating, lamination and/or affixing processes, whether impact or non-impact, known in the art, and specifically includes, for example and without limitation, screen printing, inkjet printing, electro-optical printing, electroink printing, photoresist and other resist printing, thermal printing, laser jet printing, magnetic printing, pad printing, flexographic printing, hybrid offset lithography, Gravure and other intaglio printing, for example. All such processes are considered deposition processes herein and may be utilized. The exemplary deposition or printing processes do not require significant manufacturing controls or restrictions. No specific temperatures or pressures are required. Some clean room or filtered air may be useful, but potentially at a level consistent with the standards of known printing or other deposition processes. For consistency, however, such as for proper alignment (registration) of the various successively deposited layers forming the various embodiments, relatively constant temperature (with a possible exception, discussed below) and humidity may be desirable. In addition, the various compounds utilized may be contained within various polymers, binders or other dispersion agents which may be heat-cured or dried, air dried under ambient conditions, or IR or uv cured.

It should also be noted, generally for any of the applications of various compounds herein, such as through printing or other deposition, the surface properties or surface energies may also be controlled, such as through the use of resist coatings or by otherwise modifying the "wetability" of such a surface, for example, by modifying the hydrophilic, hydrophobic, or electrical (positive or negative charge) characteristics, or by a corona treatment, for example. In conjunction with the characteristics of the compound, suspension, polymer or ink being deposited, such as the surface tension, the deposited compounds may be made to adhere to desired or selected locations, and effectively repelled from other areas or regions.

For example and without limitation, the plurality of metallic nanofibers 100 are suspended in a liquid, semi-liquid or gel carrier using any evaporative or volatile organic or inorganic compound, such as water, an alcohol, an ether, etc., which may also include an adhesive component, such as a resin, and/or a surfactant or other flow aid. In an exemplary embodiment, for example and without limitation, the plurality of metallic nanofibers 100 are suspended as described above in the Examples. A surfactant or flow aid may also be utilized, such as octanol, methanol, isopropanol, or deionized water, and may also use a binder such as an anisotropic conductive binder containing substantially or comparatively small nickel beads (e.g., 1 micron) (which provides conduction after compression and curing and may serve to improve or enhance creation of ohmic contacts, for example), or any other uv, heat or air curable binder or polymer, including those discussed in greater detail below (and which also may be utilized with dielectric compounds, lenses, and so on).

The optically transmissive, conductive film (150, 150A) formed from the cured or dried metallic nanofiber ink may be utilized in a wide variety of applications, namely, an application involving a conductor, a conductive ink or polymer or more preferably, an optically transmissive conductor. Various applications are also illustrated in the related applications, incorporated by reference herein in their entireties. Numerous additional applications will be apparent to those having skill in the art.

Various textures may be provided for the optically transmissive, conductive film embodiment 150, such as having a comparatively smooth surface, or conversely, a rough or spiky surface, or an engineered micro-embossed structure (e.g., available from Sappi, Ltd.) to potentially improve the adhesion of other layers and/or to facilitate subsequent forming of ohmic contacts with other components such as diodes 120. The optically transmissive, conductive film embodiment 150 may also be given a corona treatment prior to deposition of other components, which may tend to remove any oxides which may have formed, and also facilitate subsequent forming of ohmic contacts. Those having skill in the electronic or printing arts will recognize innumerable variations in the ways in which the optically transmissive, conductive film embodiment 150 may be formed, with all such variations considered equivalent and within the scope of the disclosure. In addition, for other various embodiments, the optically transmissive, conductive film embodiment 150 may be deposited as a single or continuous layer, such as through coating or printing, for example.

As may be apparent from the disclosure, an exemplary apparatus 150, 150A, may be designed and fabricated to be highly flexible and deformable, potentially even foldable, stretchable and potentially wearable, rather than rigid. For example, an exemplary apparatus 150, 150A, may comprise flexible, foldable, and wearable clothing, or a flexible lamp, or a wallpaper lamp, without limitation. With such flexibility, an exemplary apparatus 150, 150A, may be rolled, such as a poster, or folded like a piece of paper, and fully functional when re-opened. Also for example, with such flexibility, an exemplary apparatus 150, 150A, may have many shapes and sizes, and be configured for any of a wide variety of styles and other aesthetic goals. Such an exemplary apparatus 150, 150A, is also considerably more resilient than prior art devices.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. One having skill in the art will further recognize that additional or equivalent method steps may be utilized, or may be combined with other steps, or may be performed in different orders, any and all of which are within the scope of the claimed invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment and not necessarily in all embodiments, and further, are not necessarily referring to the same embodiment. Furthermore, the particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

All documents cited in the Detailed Description of the Invention are, in relevant part, incorporated herein by reference; the citation of any document is not to be construed as an admission that it is prior art with respect to the present invention. To the extent that any meaning or definition of a term in this document conflicts with any meaning or definition of the same term in a document incorporated by reference, the meaning or definition assigned to that term in this document shall govern.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A method of manufacturing a transparent conductor, the method comprising:
   depositing a composition on a substrate, the composition comprising:
      a plurality of metallic nanofibers at least partially coated with a first polymer comprising polyvinyl pyrrolidone (PVP) having a first molecular weight;
      a first solvent comprising cyclohexanol; and
      a second polymer or polymeric precursor mixed with the cyclohexanol and comprising polyvinyl pyrrolidone (PVP) having a second molecular weight greater than the first molecular weight; and
   heating or curing the composition.

2. The method of claim 1, wherein the step of heating or curing further comprises:
   ramp curing the composition by heating the composition to a temperature less than or equal to 160° C.

3. The method of claim 2, wherein the step of heating or curing further comprises: heating the composition for four minutes to six minutes.

4. The method of claim 1, wherein the step of heating or curing further comprises:
   exposing the composition to ultraviolet or infrared light.

5. The method of claim 1, wherein the first molecular weight is between 5,000 to 50,000 and the second molecular weight is between 500,000 and 3 million.

6. The method of claim 1, wherein the plurality of metallic nanofibers comprise silver, alloys thereof, and mixtures thereof and wherein the plurality of metallic nanofibers have lengths between 1μ and 250μ and diameters between 10 nm and 500 nm.

7. The method of claim 1, wherein the composition further comprises:
   a second solvent different from the first solvent, the second solvent selected from the group consisting of: water; alcohols; cyclic alcohols; lactones; cyclic ketones; glycols; glycerols; carboxylic acids; dicarboxylic acids; tricarboxylic acids; alkyl carboxylic acids; and mixtures thereof.

8. The method of claim 7, wherein the second solvent comprises 1-butanol and is present in an amount of 3 percent to 10 percent by weight of the composition and the first solvent is present in an amount of 50 percent to 95 percent by weight of the composition.

9. The method of claim 8, wherein the composition further comprises:
an organic acid present in an amount of 0.1% to 2% by weight of the composition, the organic acid comprising at least one acid selected from the group consisting of: carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; and mixtures thereof.

10. The method of claim 7, wherein the composition further comprises:
a third solvent, the third solvent different from the first solvent and the second solvent, the third solvent present in an amount of 0.1% to 10% by weight of the composition.

11. The method of claim 10, wherein the third solvent is at least one solvent selected from the group consisting of: water; alcohols; cyclic alcohols; lactones; cyclic ketones; glycols; glycerols; carboxylic acids; dicarboxylic acids; tricarboxylic acids; alkyl carboxylic acids; and mixtures thereof.

12. The method of claim 1, wherein the first solvent is present in an amount of 1.75 percent to 98.25 percent by weight of the composition.

13. The method of claim 1, wherein the composition further comprises:
a polyimide present in an amount of 0.75% to 5% by weight of the composition.

14. The method of claim 13, wherein the second polymer or polymeric precursor is present in an amount of 0.75% to 5% by weight of the composition.

15. The method of claim 1, wherein the composition further comprises:
polyvinyl alcohol mixed with the polyvinyl pyrrolidone and the cyclohexanol.

16. A method of manufacturing a transparent conductor, the method comprising:
depositing a composition on a substrate, the composition comprising:
a plurality of metallic nanofibers, the plurality of metallic nanofibers comprising silver, alloys thereof, and mixtures thereof, the plurality of metallic nanofibers at least partially coated with a first polymer comprising polyvinyl pyrrolidone (PVP) having a first molecular weight;
a first solvent comprising cyclohexanol; and
a second polymer or polymeric precursor mixed with the cyclohexanol and comprising polyvinyl pyrrolidone (PVP) having a second molecular weight greater than the first molecular weight; and
curing the composition to form the transparent conductor by heating the composition to a temperature less than or equal to 160° C. or by exposing the composition to ultraviolet or infrared light.

17. The method of claim 16, wherein the step of curing further comprises:
heating the composition for four minutes to six minutes.

18. The method of claim 16, wherein the composition further comprises:
a second solvent different from the first solvent and selected from the group consisting of: water; alcohols; cyclic alcohols; lactones; cyclic ketones; glycols; glycerols; carboxylic acids; dicarboxylic acids; tricarboxylic acids; alkyl carboxylic acids; and mixtures thereof; and
a third solvent, the third solvent different from the first solvent and the second solvent, the third solvent present in an amount of 0.1% to 10% by weight of the composition, wherein the third solvent is at least one solvent selected from the group consisting of: water; alcohols; cyclic alcohols; lactones; cyclic ketones; glycols; glycerols; carboxylic acids; dicarboxylic acids; tricarboxylic acids; alkyl carboxylic acids; and mixtures thereof.

19. The method of claim 16, wherein the composition further comprises:
an organic acid present in an amount of 0.1% to 2% by weight of the composition, the organic acid comprising at least one acid selected from the group consisting of: carboxylic acids, dicarboxylic acids, tricarboxylic acids, alkyl carboxylic acids, acetic acid, oxalic acid, mellitic acid, formic acid, chloroacetic acid, benzoic acid, trifluoroacetic acid, propanoic acid, butanoic acid; and mixtures thereof.

20. A method of manufacturing a transparent conductor, the method comprising:
depositing a composition on a substrate, the composition comprising:
a plurality of metallic nanofibers at least partially coated with a first polymer comprising polyvinyl pyrrolidone (PVP) having a first molecular weight;
a first solvent comprising cyclohexanol;
a second solvent different from the first solvent, wherein the second solvent is at least one solvent selected from the group consisting of: water; alcohols; cyclic alcohols; lactones; cyclic ketones; glycols; glycerols; carboxylic acids; dicarboxylic acids; tricarboxylic acids; alkyl carboxylic acids; and mixtures thereof; and
a second polymer or polymeric precursor mixed with the cyclohexanol and comprising polyvinyl pyrrolidone (PVP) having a second molecular weight greater than the first molecular weight, and wherein the second molecular weight is between 500,000 and 3 million; and
curing the composition to form the transparent conductor by heating the composition to a temperature less than or equal to 160° C. or by exposing the composition to ultraviolet or infrared light.

* * * * *